US012525495B2

(12) United States Patent
Mayukh et al.

(10) Patent No.: US 12,525,495 B2
(45) Date of Patent: Jan. 13, 2026

(54) MIXED DIELECTRIC MATERIALS FOR IMPROVING SIGNAL INTEGRITY OF INTEGRATED ELECTRONICS PACKAGES

(71) Applicant: Avago Technologies International Sales Pte. Limited., Singapore (SG)

(72) Inventors: Mayank Mayukh, Fort Collins, CO (US); Dharmendra Saraswat, Foothill Ranch, CA (US); Sam Karikalan, Ladera Ranch, CA (US); Liming Tsau, Irvine, CA (US); Sam Zhao, Irvine, CA (US); Arun Ramakrishnan, Lake Forest, CA (US); Reza Sharifi, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 656 days.

(21) Appl. No.: 17/832,541

(22) Filed: Jun. 3, 2022

(65) Prior Publication Data

US 2023/0395444 A1 Dec. 7, 2023

(51) Int. Cl.
*H01L 23/14* (2006.01)
*H01L 21/48* (2006.01)
(Continued)

(52) U.S. Cl.
CPC .......... *H01L 23/145* (2013.01); *H01L 21/486* (2013.01); *H01L 23/49827* (2013.01);
(Continued)

(58) Field of Classification Search
CPC ......... H05K 3/4688; H05K 2201/0209; H05K 2201/0212; H05K 2201/0254;
(Continued)

(56) References Cited

U.S. PATENT DOCUMENTS

2005/0100728 A1* 5/2005 Ristic-Lehmann ... F16L 59/028
524/544
2009/0200682 A1 8/2009 Zhang
(Continued)

FOREIGN PATENT DOCUMENTS

EP 0512401 A2 11/1992
JP 2001127389 A 5/2001

*Primary Examiner* — Julio J Maldonado
*Assistant Examiner* — Stanetta D Isaac
(74) *Attorney, Agent, or Firm* — Quarles & Brady LLP

(57) ABSTRACT

Novel tools and techniques are provided for implementing mixed dielectric materials for improving signal integrity of integrated electronics packages or semiconductor packages. In various embodiments, a substrate for a semiconductor device includes: a first layer made of a first material; a second layer made of a second material; and a third layer disposed between the first and second layers, and that is made of a third material different from the first and second materials. In some cases, the first, second, and third layers each contains a plurality of gas-filled regions (e.g., but not limited to, an aerogel core of the third layer and/or polymer resin matrix embedded with hollow silica spheres or aerogel spheres of the first and second layers, or the like). Coaxial ground shields around signal lines in the substrate can be used to improve signal integrity. High dielectric constant lossy lines between signal lines can reduce crosstalk.

14 Claims, 10 Drawing Sheets

(51) Int. Cl.
*H01L 23/498* (2006.01)
*H01L 23/66* (2006.01)
*H01P 3/00* (2006.01)
*H01P 11/00* (2006.01)

(52) U.S. Cl.
CPC .............. H01L 23/66 (2013.01); H01P 3/003 (2013.01); H01P 11/003 (2013.01); *H01L 2223/6616* (2013.01); *H01L 2223/6627* (2013.01)

(58) Field of Classification Search
CPC ................ H05K 1/0373; H05K 1/024; H05K 2201/09063; H01L 23/36; H01L 23/49816; H01L 23/5385; H01L 23/552; H01L 25/0655; H01L 23/538–5389; H01L 23/3128; H01L 21/4846–4867; H01L 21/2807–481; H01L 23/145; H01L 23/49827; H01L 23/66
See application file for complete search history.

(56) References Cited

U.S. PATENT DOCUMENTS

| | | |
|---|---|---|
| 2017/0231083 A1 | 8/2017 | Wu et al. |
| 2017/0250140 A1 | 8/2017 | Uzoh et al. |
| 2018/0177044 A1 | 6/2018 | Hsu et al. |

\* cited by examiner

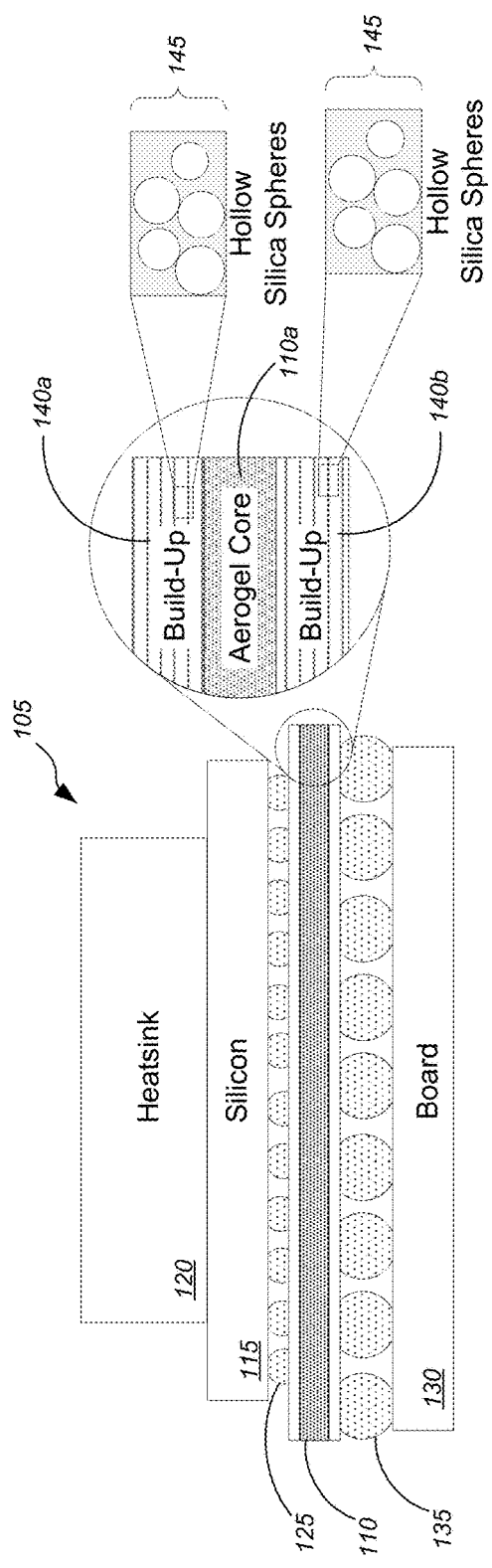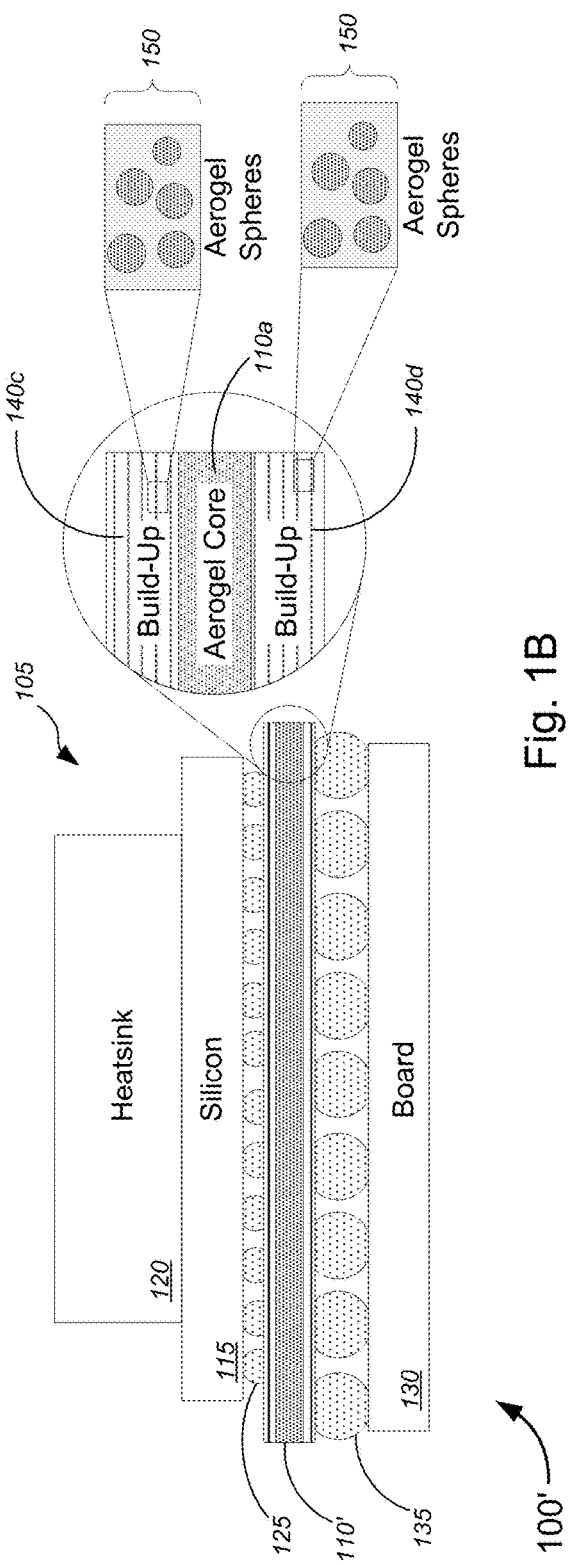

MIXED DIELECTRIC MATERIALS FOR IMPROVING SIGNAL INTEGRITY OF INTEGRATED ELECTRONICS PACKAGES

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for implementing semiconductor technology, and, more particularly, to methods, systems, and apparatuses for implementing mixed dielectric materials for improving signal integrity of integrated electronics packages or semiconductor packages.

BACKGROUND

Insertion loss and crosstalk are detrimental to signal integrity in an electronics package. These issues become particularly more concerning for signals at higher frequencies and/or at higher speed. While several higher dielectric constant (or $D_k$ or κ) materials are available, they are often considered detrimental to packages due to higher loss (e.g., electric loss and/or magnetic loss, or the like). Achieving lower $D_k$ material, on the other hand, continues to be a challenge. The pursuit of achieving a $D_k$ value similar to that of air, which has the lowest known $D_k$, continues to be a goal. Further, the core dielectric material, which is sandwiched between through vias terminating in microvias, in a typical printed circuit board could act as a waveguide and could lead to conversion between transverse electromagnetic ("TEM") mode to waveguide mode at a frequency corresponding to the core height (h) equal to ½ of that frequency. This leads to an abrupt increase in insertion loss (also referred to as "suck-out" or the like) and a resonance in crosstalk between different signals, particularly at high speed or higher frequencies.

Hence, there is a need for more robust and scalable solutions for implementing semiconductor technology, and, more particularly, to methods, systems, and apparatuses for implementing mixed dielectric materials for improving signal integrity of integrated electronics packages.

SUMMARY

The techniques of this disclosure generally relate to tools and techniques for implementing semiconductor technology, and, more particularly, to methods, systems, and apparatuses for implementing mixed dielectric materials for improving signal integrity of integrated electronics packages or semiconductor packages.

In an aspect, a substrate is provided for a semiconductor device. The substrate comprises: a first layer, the first layer comprising a first material; a second layer, the second layer comprising a second material; and a third layer disposed between the first and second layers, the third layer comprising a third material that is different from the first and second materials. In some cases, the first, second, and third layers each contain a plurality of gas-filled regions.

In some embodiments, the third material comprises an aerogel, the aerogel comprising one of a silica aerogel, an alumina aerogel, a titania aerogel, a zirconia aerogel, a carbon aerogel, or a metal oxide aerogel, or the like. In some instances, the third material has a dielectric constant of 3.0 or less.

According to some embodiments, the first layer and the second layer are buildup layers or sublayers of the substrate. In some cases, the first material and the second material each comprises a polymer resin matrix embedded with one of a plurality of hollow silica spheres or a plurality of aerogel spheres, or the like. In some cases, the plurality of aerogel spheres comprises one of a plurality of silica aerogel spheres, a plurality of alumina aerogel spheres, a plurality of titania aerogel spheres, a plurality of zirconia aerogel spheres, a plurality of carbon aerogel spheres, or a plurality of metal oxide aerogel spheres, or the like. In some instances, the second material is the same as the first material, and in some instances, the plurality of hollow silica spheres or the plurality of aerogel spheres comprises spheres of differing sizes.

In some embodiments, at least one of the first layer or the second layer comprises a plurality of sub-layers, and in some instances, the corresponding at least one of the first material and the second material each comprises a plurality of sub-materials, each sub-material and an adjacent sub-material are one of the same sub-material or a different sub-material.

According to some embodiments, the substrate further comprises: at least one first line disposed within or through the first, second, and third layers, the at least one first line being configured as a conductive signal path or as a conductive via for at least one first signal; at least one second line disposed within or through the first, second, and third layers, the at least one second line being configured as a conductive signal path or as a conductive via for at least one second signal that is different from the at least one first signal; and at least one third line disposed between the at least one first line and the at least one second line, the at least one third line comprising a fourth material that is configured as a shield between the at least one first line and the at least one second line, the fourth material having a dielectric constant that is higher than a dielectric constant of each of the first, second, and third materials.

Alternatively, or additionally, the substrate further comprises: at least one fourth line disposed within or through the first, second, and third layers, the at least one fourth line being configured as a conductive signal path or as a conductive via for at least one third signal; a first region disposed within or through the first, second, and third layers and surrounding the at least one fourth line, the first region comprising a conductive material and being configured to serve as a grounding shield, the first region having a cross-sectional shape comprising one of an annulus, an elliptical annulus, a square annulus, a rectangular annulus, or other polygonal annulus, or the like; and a second region disposed within or through the first, second, and third layers and disposed between the at least one fourth line and the first region, the second region comprising a fifth material having one of a dielectric constant that is the same as a dielectric constant of the third material, a dielectric constant that is less than the dielectric constant of the third material, or a dielectric constant that is greater than the dielectric constant of the third material.

Alternatively, or additionally, the substrate further comprises: at least one fifth line disposed on one of the first or second layers, the at least one fifth line being configured as a conductive signal path for at least one fourth signal; at least one sixth line disposed on the one of the first or second layers, the at least one sixth line being configured as a conductive signal path for at least one fifth signal that is different from the at least one fourth signal; and at least one seventh line disposed between the at least one fifth line and the at least one sixth line on the one of the first or second layers, the at least one seventh line comprising a sixth material that is configured as a shield between the at least one fifth line and the at least one sixth line, the sixth material having a dielectric constant that is higher than a dielectric constant of the first material and the second material.

In another aspect, a method comprises: forming a substrate core layer from an aerogel, the substrate core layer having a top surface and a bottom surface; forming a first buildup layer on the top surface of the substrate core layer, by forming a first polymer resin matrix on the top surface and by embedding one of a plurality of hollow silica spheres or a plurality of aerogel spheres in the first polymer resin matrix; and forming a second buildup layer on the bottom surface of the substrate core layer, by forming a second polymer resin matrix on the bottom surface and by embedding one of a plurality of hollow silica spheres or a plurality of aerogel spheres in the second polymer resin matrix.

In some embodiments, the aerogel comprises one of a silica aerogel, an alumina aerogel, a titania aerogel, a zirconia aerogel, a carbon aerogel, or a metal oxide aerogel, or the like. In some cases, the aerogel has a dielectric constant of 3.0 or less.

According to some embodiments, the plurality of aerogel spheres comprises one of a plurality of silica aerogel spheres, a plurality of alumina aerogel spheres, a plurality of titania aerogel spheres, a plurality of zirconia aerogel spheres, a plurality of carbon aerogel spheres, or a plurality of metal oxide aerogel spheres, or the like.

In some instances, at least one of the first buildup layer or the second buildup layer comprises a plurality of sub-layers. For the first buildup layer that has a plurality of sub-layers, forming the first buildup layer comprises forming a plurality of first sub-layers with intervening conductive layers between first sub-layers, and in some instances, the plurality of first sub-layers is made of a corresponding plurality of first sub-materials, and in some instances, each first sub-material and an adjacent first sub-material are one of the same sub-material or a different sub-material. Similarly, for the second buildup layer that has a plurality of sub-layers, forming the second buildup layer comprises forming a plurality of second sub-layers with intervening conductive layers between second sub-layers, and in some instances, the plurality of second sub-layers is made of a corresponding plurality of second sub-materials, and in some instances, each second sub-material and an adjacent second sub-material are one of the same sub-material or a different sub-material.

In some embodiments, the method further comprises: forming at least one first line disposed within or through the first buildup layer, the substrate core layer, and the second buildup layer, by forming at least one first hole through the first buildup layer, the substrate core layer, and the second buildup layer, and by filling the at least one first hole with a conductive material, the at least one first line being configured as a conductive signal path or as a conductive via for at least one first signal; forming at least one second line disposed within or through the first buildup layer, the substrate core layer, and the second buildup layer, by forming at least one second hole through the first buildup layer, the substrate core layer, and the second buildup layer, and by filling the at least one second hole with a conductive material, the at least one second line being configured as a conductive signal path or as a conductive via for at least one second signal that is different from the at least one first signal; and forming at least one third line disposed between the at least one first line and the at least one second line, by forming at least one third hole through the first buildup layer, the substrate core layer, and the second buildup layer and between the at least one first line and the at least one second line, and by filling the at least one third hole with a first dielectric material, the at least one third line being configured as a shield between the at least one first line and the at least one second line, the first dielectric material having a dielectric constant that is higher than a dielectric constant of each of the first buildup layer, the substrate core layer, and the second buildup layer.

Alternatively, or additionally, the method further comprises: forming a fourth hole in the first buildup layer, the substrate core layer, and the second buildup layer; forming a first region within the fourth hole, by forming a conductive wall region along a perimeter of the fourth hole, extending from the second buildup layer through the substrate core layer to the first buildup layer, resulting in a fifth hole in the first buildup layer, the substrate core layer, and the second buildup layer, a perimeter of the fifth hole being defined by an inner surface of the conductive wall region; forming a second region within the fifth hole, by filling the fifth hole with a second dielectric material, the second dielectric material having one of a dielectric constant that is the same as a dielectric constant of the aerogel, a dielectric constant that is less than the dielectric constant of the aerogel, or a dielectric constant that is greater than the dielectric constant of the aerogel; forming at least one sixth hole in a middle portion of the second region; and forming at least one fourth line within the second region, by filling the at least one sixth hole with conductive material.

In yet another aspect, a semiconductor package, comprising: a substrate comprising one or more layers each containing a plurality of gas-filled regions; at least one first line disposed on a surface of, within, or through the substrate, the at least one first line being configured as a conductive signal path for at least one first signal; at least one second line disposed on a surface of, within, or through the substrate, the at least one second line being configured as a conductive signal path for at least one second signal; and at least one third line disposed between the at least one first line and the at least one second line, the at least one third line comprising a first dielectric material that is configured as a shield between the at least one first line and the at least one second line, the first dielectric material having a dielectric constant that is higher than a dielectric constant of the one or more materials of the substrate.

In some embodiments, the substrate further comprises: at least one first layer, the at least one first layer comprising at least one first material among the one or more materials; at least one second layer, the at least one second layer comprising at least one second material among the one or more materials; and a third layer disposed between the at least one first layer and the at least one second layer, the third layer comprising a third material among the one or more materials, the third material being different from each of the at least one first material and the at least one second material. In some cases, the at least one first layer and the at least one second layer are the buildup layers or sublayers of the substrate, and in some instances, the at least one first material and the at least one second material each comprises a polymer resin matrix embedded with one of a plurality of hollow silica spheres or a plurality of aerogel spheres, and in some instances, the plurality of aerogel spheres comprises one of a plurality of silica aerogel spheres, a plurality of alumina aerogel spheres, a plurality of titania aerogel spheres, a plurality of zirconia aerogel spheres, a plurality of carbon aerogel spheres, or a plurality of metal oxide aerogel spheres, or the like. In some instances, the third layer is a core layer of the substrate, and in some instances, the third material of the substrate comprises an aerogel, the aerogel comprising one of a silica aerogel, an alumina aerogel, a titania aerogel, a zirconia aerogel, a carbon aerogel, or a metal oxide aerogel, or the like, and in some instances, the third material of the substrate has a dielectric constant of 3.0 or less.

According to some embodiments, the at least one first line and the at least one second line are each configured as a conductive via through the at least one first layer, the at least one second layer, and the third layer of the substrate, and in some instances, the at least one third line is configured as a dielectric via through the at least one first layer, the at least one second layer, and the third layer of the substrate and between the conductive vias of the at least one first line and the at least one second line, and in some instances, the dielectric via is further configured as a lossy and absorptive shield that reduces crosstalk between the at least one first line and the at least one second line.

In some instances, the at least one first line comprises a pair of receiver signal lines, while the at least one second line comprises a pair of transmission signal lines.

In some embodiments, the semiconductor package further comprises: at least one fourth line disposed within or through the substrate, the at least one fourth line being configured as a conductive signal path or as a conductive via for at least one third signal; a first region disposed within or through the substrate and surrounding the at least one fourth line, the first region comprising a conductive material and being configured to serve as a grounding shield, the first region having a cross-sectional shape comprising one of an annulus, an elliptical annulus, a square annulus, a rectangular annulus, or other polygonal annulus; and a second region disposed within or through the substrate and disposed between the at least one fourth line and the first region, the second region comprising a second dielectric material having one of a dielectric constant that is the same as a dielectric constant of the one or more materials of the substrate, a dielectric constant that is less than the dielectric constant of the one or more materials of the substrate, or a dielectric constant that is greater than the dielectric constant of the one or more materials of the substrate.

Various modifications and additions can be made to the embodiments discussed without departing from the scope of the invention. For example, while the embodiments described above refer to particular features, the scope of this invention also includes embodiments having different combination of features and embodiments that do not include all of the above-described features.

The details of one or more aspects of the disclosure are set forth in the accompanying drawings and the description below. Other features, objects, and advantages of the techniques described in this disclosure will be apparent from the description and drawings, and from the claims.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIGS. 1A-1E are schematic diagrams illustrating various non-limiting examples of semiconductor packages for implementing mixed dielectric materials for improving signal integrity of the semiconductor packages, in accordance with various embodiments.

DETAILED DESCRIPTION

Overview

Figure 1C:
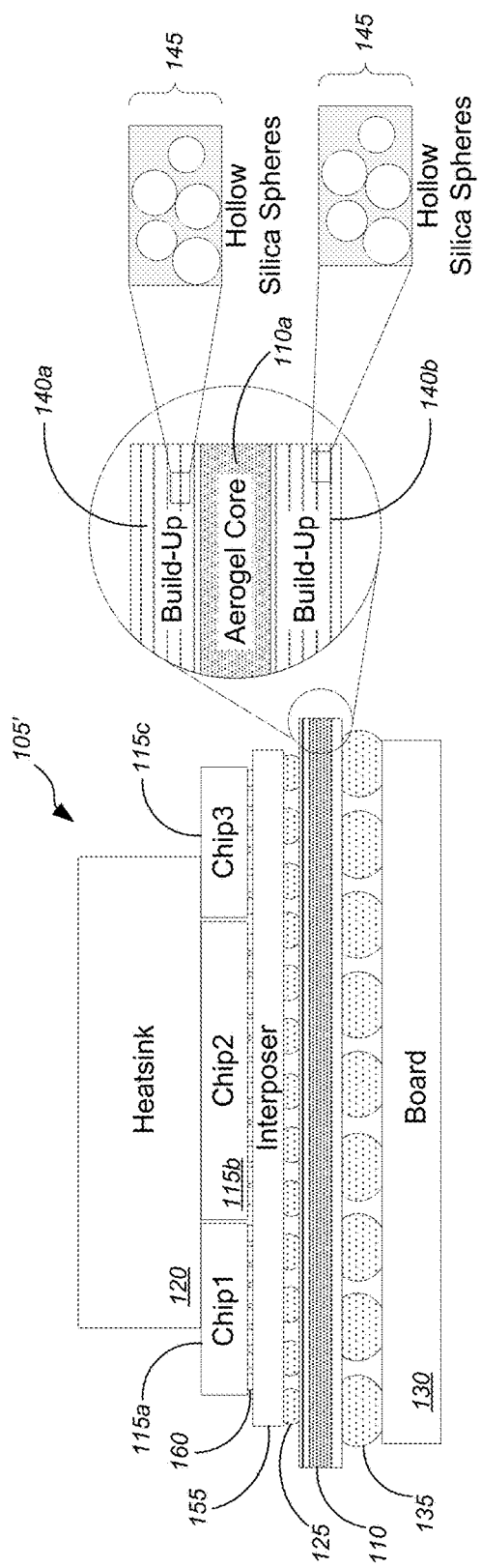

Various embodiments provide tools and techniques for implementing semiconductor technology, and, more particularly, to methods, systems, and apparatuses for implementing mixed dielectric materials for improving signal integrity of integrated electronics packages or semiconductor packages.

In various embodiments, lower dielectric constant (or $D_k$ or κ) materials can be created by embedding hollow silica spheres inside a polymer resin matrix. Hollow silica spheres, which are filled with air, can impart lower $D_k$. Hollow spheres can replace typically used solid silica sphere in a buildup film or layer in a printed circuit board substrate to impart lower $D_k$. Alternatively, lower $D_k$ material can be created by embedding aerogel spheres inside a polymer resin matrix. Aerogels are highly porous solid materials containing more than 95% air. Aerogels can replace a center-core layer of a printed circuit board substrate, which can enable routing in the core, which in current packages are used only for proving mechanical integrity. Aerogel spheres can also replace typically used solid silica spheres in a buildup film or layer in printed circuit board substrate to impart lower $D_k$.

In some cases, higher $D_k$, lossy dielectric materials can be used to shield between transmitter and receiver differential signal pairs in the PCB substrate to reduce crosstalk between the two signal pairs. According to some embodiments, adding a coaxial ground shield filled with dielectric material (e.g., low $D_k$ aerogel materials, high D k lossy dielectric materials, or the like) around signal vias can help keep the transverse electromagnetic ("TEM") mode confined within the shield, thereby preventing any leakage into waveguide mode. Further, this will reduce (if not prevent) "suck-out" in the insertion loss as well as reducing (if not preventing) resonances in crosstalk, thereby improving signal integrity.

These and other aspects of the substrate, semiconductor package, and method for implementing mixed dielectric materials for improving signal integrity of integrated electronics packages or semiconductor packages are described in greater detail with respect to the figures.

The following detailed description illustrates a few embodiments in further detail to enable one of skill in the art to practice such embodiments. The described examples are provided for illustrative purposes and are not intended to limit the scope of the invention.

In the following description, for the purposes of explanation, numerous details are set forth in order to provide a thorough understanding of the described embodiments. It will be apparent to one skilled in the art, however, that other embodiments of the present invention may be practiced without some of these details. In other instances, some structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Some Embodiments

We now turn to the embodiments as illustrated by the drawings. FIGS. 1-5 illustrate some of the features of the method, system, and apparatus for implementing semiconductor technology, and, more particularly, to methods, systems, and apparatuses for implementing mixed dielectric materials for improving signal integrity of integrated electronics packages or semiconductor packages, as referred to above. The methods, systems, and apparatuses illustrated by FIGS. 1-5 refer to examples of different embodiments that include various components and steps, which can be considered alternatives or which can be used in conjunction with one another in the various embodiments. The description of the illustrated methods, systems, and apparatuses shown in FIGS. 1-5 is provided for purposes of illustration and should not be considered to limit the scope of the different embodiments.

Figure 1D:
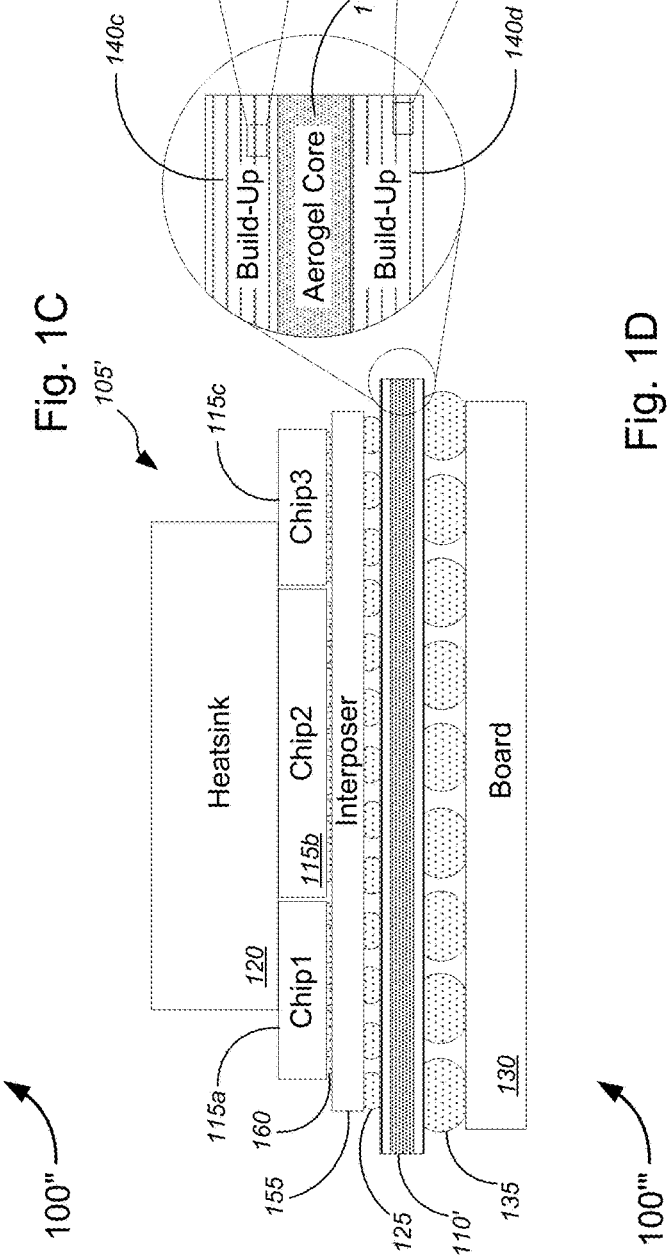
Figure 1E:
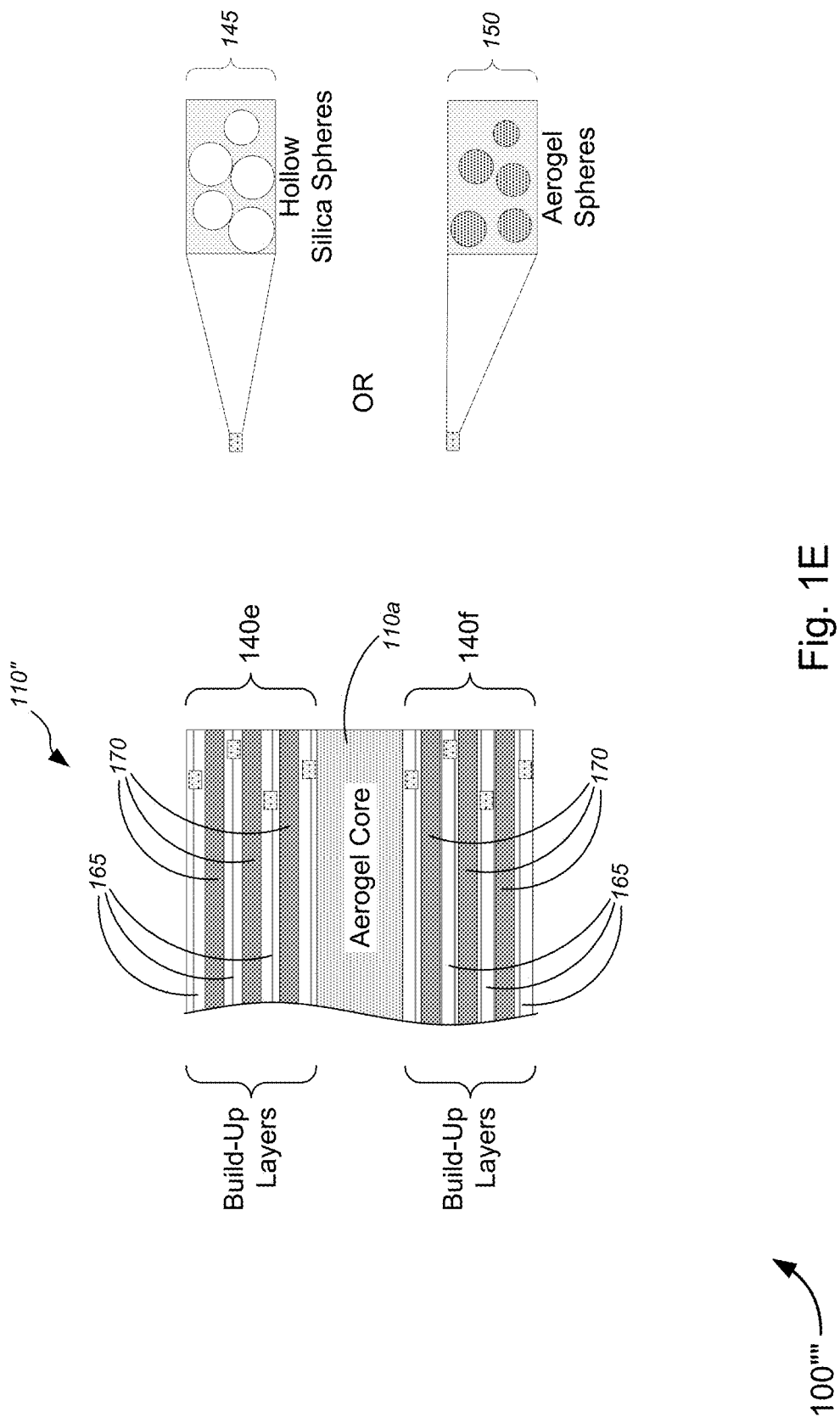

With reference to the figures, FIGS. 1A-1E (collectively, "FIG. 1") are schematic diagrams illustrating various non-limiting examples 100, 100', 100", 100''', and 100'''' of semiconductor packages for implementing mixed dielectric materials for improving signal integrity of the semiconductor packages, in accordance with various embodiments. FIGS. 1A and 1B depict a non-limiting example of a monolithic semiconductor package, one with a substrate 110 having buildup layers or sublayers 140a and 140b containing a plurality of hollow silica spheres 145 (FIG. 1A), the other with a substrate 110' having buildup layers or sublayers 140c and 140d containing a plurality of aerogel silica spheres 150 (FIG. 1B). FIGS. 1C and 1D are similar to FIGS. 1A and 1B, respectively, except that instead of the monolithic semiconductor package of FIGS. 1A and 1B, FIGS. 1C and 1D depict a non-limiting example of a semiconductor package with a multi-chip structure. In some embodiments, the semiconductor package 105 or 105' includes, but is not limited to, one of an application-specific integrated circuit ("ASIC") semiconductor package, a system-on-a-chip ("SOC") semiconductor package, a field programmable gate array ("FPGA") semiconductor package, or other semiconductor package, or the like. FIG. 1E depicts a substrate 110" that includes buildup layers or sublayers 140e and 140f, each comprising a plurality of sub-layers. Herein, in some cases, "buildup layer" or "build-up layer" may refer to layers of the substrate including, without limitation, at least one of one or more dielectric layers, one or more power layers, one or more signal layers, or one or more other layers, and/or the like, and in some cases, may also be referred to as "one or more sublayers" or "one or more sub-layer" or the like.

Referring to the non-limiting examples 100 and 100' of FIGS. 1A and 1B, respectively, the semiconductor package 105 comprises a substrate 110, a silicon-based chip 115 with a heatsink 120, the silicon-based chip 115 being bonded to the substrate 110 using controlled collapse of chip connection ("C4") joints 125 (also referred to as "C4 bumps" or "C4 solder bumps" or the like). The C4 joints 125 are formed on predetermined portions of the silicon-based chip 115 and align with corresponding contact pads on the substrate 110. During a mass reflow process (such as in a reflow oven or the like), the C4 joints 125 are heated and reflow over both the predetermined portions of the silicon-based chip 115 and the corresponding contact pads on the substrate 110, with each C4 joint 125 forming a solid solder joint when cooled. The semiconductor package 105 further comprises a board 130 that is similarly bonded (e.g., using a similar, or the same, reflow technique described above with respect to the C4 joints 125, or the like) to the opposite side of the substrate 110 using ball grid array ("BGA") joints 135.

Turning to the non-limiting examples 100" and 100'" of FIGS. 1C and 1D, respectively, instead of a monolithic silicon-based chip 115, the semiconductor package 105' comprises a plurality of chips 115a-115c (although not limited to the three chips shown in FIGS. 1C and 1D) and an interposer layer 155 between substrate 110 and each of, some of, or all of chips 115a-115c. In these embodiments, the C4 joints 125 connect the substrate 110 to the interposer 155, while the C4 joints 160 connect the interposer 155 to each of the chips 115a-115c, both in a similar manner as described above with respect to the reflow technique for connecting the C4 joints 125 and the silicon-based chip 115 of FIGS. 1A and 1B.

With reference to the non-limiting examples 100 and 100" of FIGS. 1A and 1C, respectively, substrate 110 comprises a core layer 110a as well as a first buildup layer 140a and a second buildup layer 140b sandwiching the core layer 110a. According to some embodiments, the core layer 110a is made of a material that includes an aerogel (such as the aerogel core shown in FIG. 1, or the like). In some instances, the aerogel includes, but is not limited to, one of a silica aerogel, an alumina aerogel, a titania aerogel, a zirconia aerogel, a carbon aerogel, or a metal oxide aerogel, or the like. In some cases, the material (e.g., the aerogel) is a low dielectric constant material having at least one of a low electric loss tangent material or a low magnetic loss tangent material. Herein, in some cases, "low dielectric constant" refers to a dielectric constant that is low compared with the dielectric constant of silica or silicon dioxide (e.g., $D_{K\_SiO2}$ or $\kappa_{\_SiO2} \cong 3.7$-$3.9$). By contrast, "high dielectric constant" refers to a dielectric constant that is high compared with the dielectric constant of silica or silicon dioxide. In some instances, the core layer 110a (also referred to as "aerogel," "aerogel substrate core," "aerogel substrate core layer," "substrate core," or "substrate core layer," or the like) has a dielectric constant that is similar to the dielectric constant of air (e.g., $D_{K\_air}$ or $\kappa_{\_air} \cong 1.0$) to within 1-10% of that value (e.g., $D_{K\_aerogel}$ or $\kappa_{\_aerogel} \cong 1.01$-$1.1$). In some embodiments, "low dielectric constant" may refer to a dielectric constant between ~1.0 and ~4.0, in some cases between ~1.0 and ~3.0. Alternatively, "low dielectric constant" may refer to a dielectric constant of 3.0 or less. Herein, in some cases, "low electric loss tangent" and "low magnetic loss tangent" refer to dielectric loss that is parameterized in terms of loss tangent tan δ (although may also be parameterized as loss angle δ). Both the loss tangent and the loss angle refer to the phasor in the complex plane whose real and imaginary parts are the resistive (or lossy) component of an electromagnetic field and its reactive (or lossless) counterpart. For dielectric materials with low loss (whether electric loss or magnetic loss), the loss tangent≈0, while the loss tangent<<1. The electric loss tangent is calculated based on tangent of the (lossless) imaginary component of permittivity divided by the (lossy) real component of permittivity of the dielectric material, while the magnetic loss tangent is calculated based on the tangent of the (lossless) imaginary component of magnetic permeability divided by the (lossy) real component of magnetic permeability of the dielectric material.

In some embodiments, the first buildup layer 140a and the second buildup layer 140b are each made of a material that includes, without limitation, a polymer resin matrix embedded with a plurality of hollow silica spheres 145. In some cases, the first buildup layer 140a and the second buildup layer 140b are the same, where the polymer resin matrix embedded with the plurality of hollow silica spheres 145 of one layer 140a (or 140b) is the same as that of the other layer 140b (or 140a). Alternatively, in some instances, although each comprises a polymer resin matrix embedded with a plurality of hollow silica spheres 145, the second buildup layer 140b is different from the first buildup layer 140a, with different compositions of the polymer resin matrix embedded with the plurality of hollow silica spheres 145 (e.g., with different densities of hollow silica spheres or with different average sizes of the hollow silica spheres, with different polymer resins, with different density of the polymer resin, and/or the like).

Alternatively, referring to the non-limiting examples 100' and 100''' of FIGS. 1B and 1D, respectively, instead of the substrate 110 with buildup layers or sublayers 140a and 140b containing the plurality of hollow silica spheres 145, the substrate 110' of semiconductor package 105 of FIG. 1B and the substrate 110' of semiconductor package 105' of FIG. 1D each comprises a core layer 110a as well as a third buildup layer 140c and a fourth buildup layer 140d sandwiching the core layer 110a. The core layer 110a of FIGS. 1B and 1D is otherwise similar, if not identical, to core layer 110a of FIGS. 1A and 1C. According to some embodiments, the third buildup layer 140c and the fourth buildup layer 140d are each made of a material that includes, without limitation, a polymer resin matrix embedded with a plurality of aerogel spheres 150 (such as, but not limited to the aerogel silica spheres shown in FIGS. 1B and 1D, or the like). In some instances, the plurality of aerogel spheres includes, without limitation, one of a plurality of silica aerogel spheres, a plurality of alumina aerogel spheres, a plurality of titania aerogel spheres, a plurality of zirconia aerogel spheres, a plurality of carbon aerogel spheres, or a plurality of metal oxide aerogel spheres, or the like. In some cases, the third buildup layer 140c and the fourth buildup layer 140d are the same, where the polymer resin matrix embedded with the plurality of aerogel spheres 150 of one layer 140c (or 140d) is the same as that of the other layer 140d (or 140c). Alternatively, in some instances, although each comprises a polymer resin matrix embedded with a plurality of aerogel spheres 150, the fourth buildup layer 140d is different from the third buildup layer 140c, with different compositions of the polymer resin matrix embedded with the plurality of aerogel spheres 150 (e.g., with different densities of aerogel spheres or with different average sizes of the aerogel spheres, with different polymer resins, with different densities of the polymer resin, different dielectric constants, different dielectric losses, different electric loss tangents, different magnetic loss tangents, and/or the like).

In some embodiments, instead of substrate 110 of FIGS. 1A and 1C or 110' of FIGS. 1B and 1D, semiconductor package 105 of FIGS. 1A and 1B or 105' of FIGS. 1C and 1D comprises substrate 110'' of FIG. 1E. As shown in the non-limiting example 100'''' of FIG. 1E, substrate 110'' comprises a core layer 110a (which similar to core layer 110a in FIGS. 1A-1D, or the like) and buildup layers or sublayers 140e and 140f. Each of buildup layers or sublayers 140e and 140f includes, without limitation, a plurality of sub-layers with alternating dielectric layers 165 and conductive layers 170. Each dielectric layer 165 corresponds to the buildup layer 140a, 140b, 140c, or 140d in FIGS. 1A-1D, with a dielectric layer 165 disposed between two adjacent conductive layers 170. Each conductive layer 170 is made of any suitable conductor used for semiconductor layers, including, but not limited to, copper, aluminum, etc. Each conductive layer 170 is connected to one of signal, ground, or power, and thus serves as a signal layer, a ground layer, or a power layer, respectively. Each conductive layer 170 also contains suitable dielectric materials to separate different conductive lines (for signal, ground, or power) within said conductive layer 170 from each other and from conductive vias through said conductive layer 170.

According to some embodiments, depending on desired characteristics of adjacent signal, ground, or power layers among the conductive layers 170, a dielectric layer 165 among the plurality of dielectric layers 165 is made of either a polymer resin matrix embedded with a plurality of hollow silica spheres 145 (such as in buildup layers or sublayers 140a and 140b of FIGS. 1A and 1C) or a polymer resin matrix embedded with a plurality of aerogel spheres 150 (such as in buildup layers or sublayers 140c and 140d of FIGS. 1B and 1D). In this manner, the dielectric layers 165 of buildup layers or sublayers 140e or 140f can be one of all dielectric layers 165 comprising polymer resin matrix embedded with a plurality of hollow silica spheres 145, all dielectric layers 165 comprising polymer resin matrix embedded with a plurality of aerogel spheres 150, or some dielectric layers 165 comprising polymer resin matrix embedded with a plurality of hollow silica spheres 145 while other dielectric layers 165 are made of polymer resin matrix embedded with a plurality of aerogel spheres 150, or the like.

Further, for each dielectric layer 165 (regardless of containing hollow silica spheres or aerogel spheres) can be made with different compositions of the polymer resin matrix, such that each dielectric layer 165 among the plurality of dielectric layers in buildup layers or sublayers 140e or 140f is made to have different characteristics (including, but not limited to, different densities of hollow silica or aerogel spheres, different average sizes of the hollow silica or aerogel spheres, different polymer resins, different densities of the polymer resin, different dielectric constants, different dielectric losses, different electric loss tangents, different magnetic loss tangents, and/or the like). In some cases, the buildup layers or sublayers 140f are the same as the buildup layers or sublayers 140e. In other cases, the buildup layers or sublayers 140f are different from the buildup layers or sublayers 140e, with their own combination of types of polymer resin matrix, types of spheres (e.g., hollow silica or aerogel spheres), and characteristics (as listed above), or the like. Although FIG. 1E shows each of buildup layers or sublayers 140e and 140f having four dielectric layers 165 and three conductive layers 170 with a dielectric layer 165 in contact with the core layer 110a, the various embodiments are not so limited, and any suitable number of dielectric layers 165 and conductive layers 170 can be used with either a dielectric layer 165 or a conductive layer 170 being disposed on (or in contact with) core layer 110a and with either a dielectric layer 165 or a conductive layer 170 on the outermost layer relative to core layer 110a, as desired or as appropriate for particular applications of a semiconductor package.

As the core layer 110a is formed from aerogel, the first and second buildup layers or sublayers 140a and 140b are formed from polymer resin matrices with hollow silica spheres 145, and the third and fourth buildup layers or sublayers 140c and 140d are formed from polymer resin matrices with aerogel spheres 150, these layers each contains a plurality of gas-filled regions (e.g., regions filled with air or other gases). Buildup layers or sublayers 140e and 140f are formed from a plurality of alternative dielectric layers 165 and conductive layers 170 with customizable combinations of materials and characteristics (as described above). As the dielectric layers 165 are similar to those of buildup layers 140a-140d, these layers 165 each also contains a plurality of gas-filled regions. Herein, in some cases, "gas-filled regions" may refer to regions within the layers of the substrate that contain air and/or other gas(es) within hollow silica or other spheres and/or aerogel spheres, or the like.

In some aspects, semiconductor packages 105 or 105' comprises at least one first line disposed on a surface of, within, or through the substrate 110, 110', or 110", the at least one first line being configured as a conductive signal path for at least one first signal; at least one second line disposed on a surface of, within, or through the substrate 110, 110', or 110", the at least one second line being configured as a conductive signal path for at least one second signal; and at least one third line disposed between the at least one first line and the at least one second line. In some cases, the at least one third line includes a first dielectric material that is configured as a shield between the at least one first line and the at least one second line. The first dielectric material has a dielectric constant that is higher than a dielectric constant of the one or more materials of the substrate 110, 110', or 110". In some embodiments, the at least one first line and/or the at least one second line need not be straight lines. For instance, the at least one first line and/or the at least one second line may each include, without limitation, one or more traces or one or more conductive vias that are each at least one of a straight line, a curved line, a patterned line, a labyrinthine line, a meandering line, a thick line, a thin line, or a combination thereof. In some cases, the one or more traces or the one or more conductive vias in a line need not be vertically aligned.

According to some embodiments, the at least one first line and the at least one second line are each configured as a conductive via through the layers of the substrate 110, 110', or 110", while the at least one third line is configured as a dielectric via through the layers of the substrate 110, 110', or 110" and between the conductive vias of the at least one first line and the at least one second line. The dielectric via is further configured as a lossy and absorptive shield that reduces crosstalk between the at least one first line and the at least one second line. In some embodiments, the buildup layers or sublayers 140 of substrate 110, 110', or 110" may include, without limitation, any suitable or appropriate number of layers 140 in direct contact with adjacent buildup layers, or any suitable or appropriate number of intervening layers (including, but not limited to, one or more dielectric layers, one or more power layers, one or more signal layers, or one or more other layers, and/or the like) between pairs of buildup layers, and/or the like. Similarly, in some cases, the first and second layers may each directly contact the third layer (or substrate core layer), while, in other cases, one or more intervening layers may be included between the third layer (or substrate core layer) and each of the first or second layers. Herein, in some cases, the lossy and absorptive shield provide a shielding effect based on the lossy nature and/or the absorptive nature of the dielectric via.

In some instances, the at least one first line includes, but is not limited to, a pair of receiver signal lines, while the at least one second line includes, but is not limited to, a pair of transmission signal lines.

In some embodiments, the semiconductor package 105 or 105' further comprises: at least one fourth line disposed within or through the substrate 110, 110', or 110", the at least one fourth line being configured as a conductive signal path or as a conductive via for at least one third signal; a first region disposed within or through the substrate 110, 110', or 110" and surrounding the at least one fourth line, the first region including a conductive material and being configured to serve as a grounding shield; and a second region disposed within or through the substrate 110, 110', or 110" and disposed between the at least one fourth line and the first region, the second region including a second dielectric material. In some instances, the first region has a cross-sectional shape including, but not limited to, one of an annulus, an elliptical annulus, a square annulus, a rectangular annulus, or other polygonal annulus. In some cases, the second dielectric material has one of (i) a dielectric constant that is the same as a dielectric constant of the one or more materials of the substrate 110, 110', or 110", (ii) a dielectric constant that is less than the dielectric constant of the one or more materials of the substrate, or (iii) a dielectric constant that is greater than the dielectric constant of the one or more materials of the substrate.

These and other functions of the examples 100, 100', 100", 100''', and 100'''' of semiconductor packages (and their components) are described in greater detail below with respect to FIGS. 2-5.

Figure 2B:
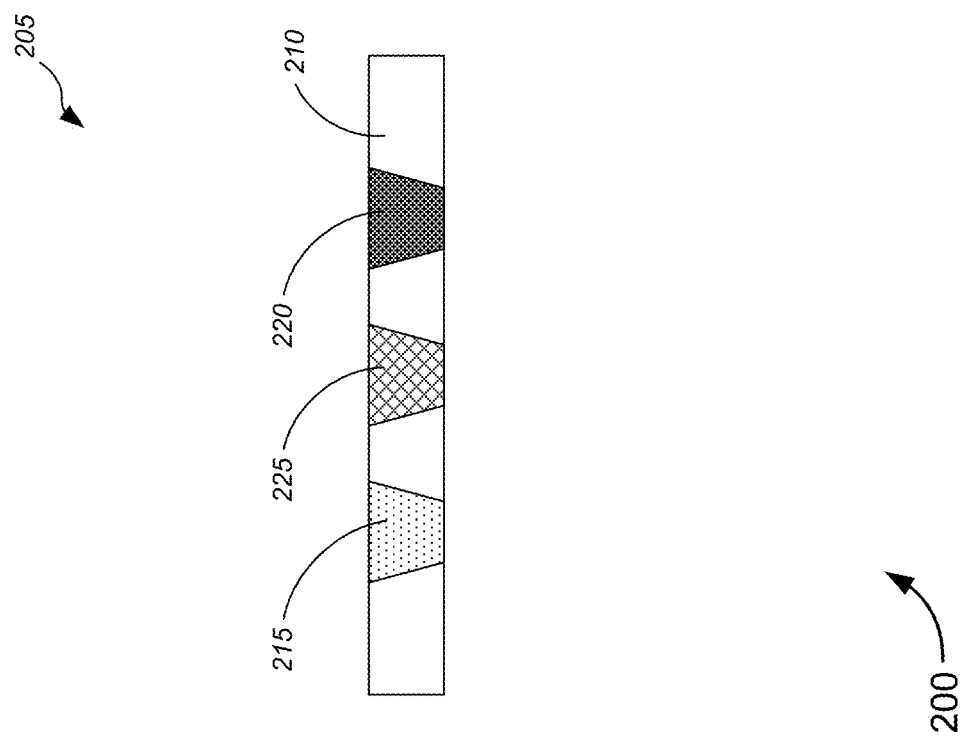
FIGS. 2A and 2B are schematic diagrams illustrating various views of a non-limiting example of a semiconductor substrate with a dielectric-filled via between a first pair of conductive vias and a second pair of conductive vias that are disposed in the semiconductor substrate, in accordance with various embodiments.
Figure 2A:
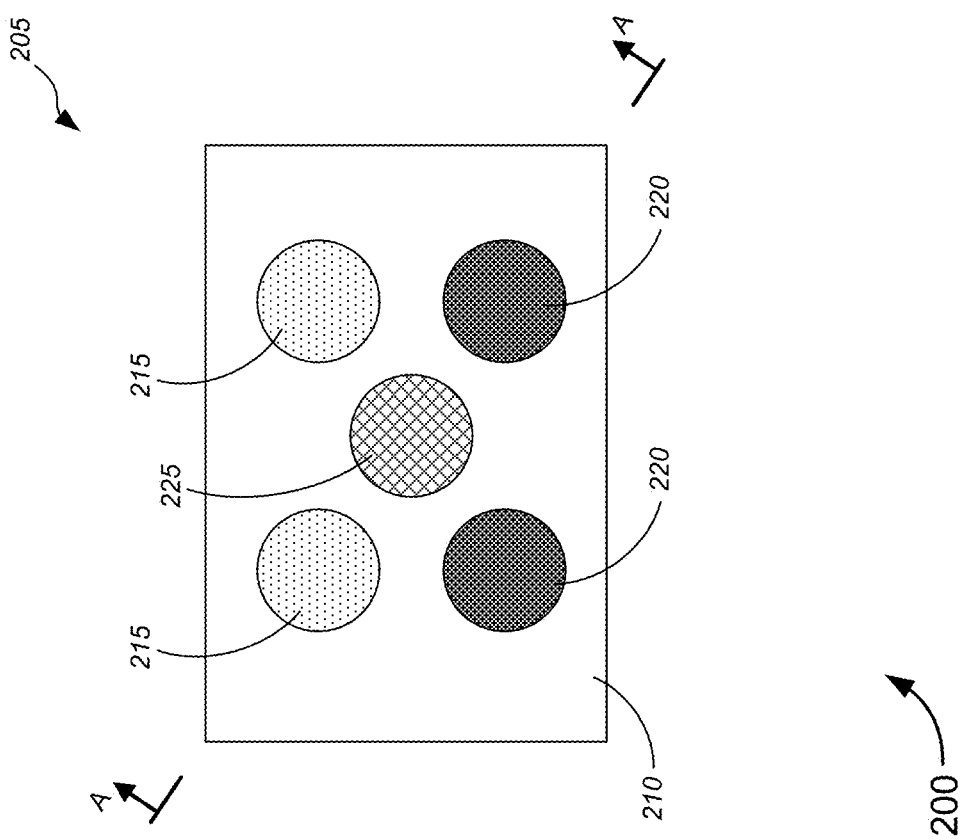

FIGS. 2A and 2B (collectively, "FIG. 2") are schematic diagrams illustrating various views of a non-limiting example 200 of a semiconductor substrate with a dielectric-filled via between a first pair of conductive vias and a second pair of conductive vias that are disposed in the semiconductor substrate, in accordance with various embodiments. FIG. 2A shows a top view of a semiconductor device, substrate, and/or package 205, while FIG. 2B shows a cross-sectional lateral view of the semiconductor device, substrate, and/or package 205 taken along the A-A direction denoted in FIG. 2A by the pair of sectional arrows each labelled "A."

As shown in the non-limiting example 200 of FIG. 2, semiconductor device, substrate, and/or package 205 comprises a substrate 210, which may include, without limitation, (a) a conventional printed circuit board ("PCB") substrate or (b) a substrate as shown and described above with respect to FIG. 1 (e.g., a substrate having an aerogel core layer sandwiched by buildup layers or sublayers made of polymer resin matrix embedded with one of a plurality of hollow silica spheres 145 or a plurality of aerogel spheres 150, or the like). In some embodiments, semiconductor device, substrate, and/or package 205 and/or substrate 210 includes, without limitation, at least one receiver signal line 215 (in this case, a pair of receiver signal lines, although not limited to two; similar to at least one first line described above with respect to FIG. 1, or the like), at least one transmitter signal line 220 (in this case, a pair of transmitter signal lines, although not limited to two; similar to at least one second line described above with respect to FIG. 1, or the like), and at least one dielectric line 225 (in this case, a single dielectric line, although not limited to one; similar to the at least one third line described above with respect to FIG. 1, or the like).

According to some embodiments, the at least one receiver signal line 215 and the at least one transmitter signal line 220 are each disposed within or through substrate 210 (in this case, as a conductive signal path or a conductive via, or the like), with the at least one dielectric line 225 disposed between the at least one receiver signal line 215 and the at least one transmitter signal line 220. Herein, in some cases, "between" refers to one of directly between (such as with the dielectric line 225 being directly between the left receiver signal line 215 and the right transmitter signal line 220 in FIGS. 2A and 2B, or as with the dielectric line 225 being directly between the right receiver signal line 215 and the left transmitter signal line 220 in FIG. 2A), partially between one or more of the at least one receiver signal line 215 and one or more of the at least one transmitter signal line 220 (not shown), between one or more of the at least one receiver signal line 215 and one or more of the at least one transmitter signal line 220 along one direction (such as with the dielectric line 225 being between the left receiver signal line 215 and the left transmitter signal line 220 along a width direction of the substrate 210 in FIGS. 2A, as with the dielectric line 225 being between the right receiver signal line 215 and the left transmitter signal line 220 along a length direction of the substrate 210 in FIG. 2A), or between two or more of the at least one receiver signal lines 215 and two or more of the at least one transmitter signal lines 220 (as with the dielectric line 225 being between two or more receiver signal lines 215 and two or more transmitter signal lines 220 in FIG. 2A), or the like.

As shown in FIG. 2B, in some cases, each of the at least one receiver signal line 215, the at least one transmitter signal line 220, and the at least one dielectric line 225 that are configured as vias within or through the substrate 210 has a diameter that is larger at one end compared with its diameter at the other end (such as a larger diameter at or near a top surface of the substrate 210 with a smaller diameter at or near a bottom surface of the substrate 210, as shown in FIG. 2B, or the like; although not limited to such) (e.g., forming a truncated cone in three-dimensional ("3D") view or a trapezoid in two-dimensional ("2D") cross-sectional view, or the like). Alternatively, although not shown, each of the at least one receiver signal line 215, the at least one transmitter signal line 220, and the at least one dielectric line 225 that are configured as vias within or through the substrate 210 is a cylinder (i.e., with equal diameters throughout its length). Alternatively, although also not shown, each of the at least one receiver signal line 215, the at least one transmitter signal line 220, and the at least one dielectric line 225 that are configured as vias within or through the substrate 210 has a diameter that is larger at both ends compared with its diameter at a middle portion (e.g., forming an hour-glass in 3D view or in 2D cross-sectional view, or the like).

In some instances, each of the at least one receiver signal line 215 and the at least one transmitter signal line 220 is formed from a conductive material (e.g., a metal, such as but not limited to, copper, or any suitable conductor, or the like). In some cases, the at least one dielectric line 225 is formed from a dielectric material having a dielectric constant that is greater than a dielectric constant of the substrate 210. With a greater dielectric constant (e.g., with high dielectric constant, relative to that of silica) compared with a dielectric constant of substrate 210 (which has, e.g., low dielectric constant, such as in the case of the substrate 110, 110', or 110" of FIG. 1, or the like), the at least one dielectric line 225 serves as a lossy and/or absorptive shield that reduces (if not prevents) crosstalk between the receiver signal line(s) 215 and the transmitter signal line(s) 220.

Alternatively, although not shown, instead of being vias within or through the substrate 210, each of the at least one receiver signal line 215, the at least one transmitter signal line 220, and the at least one dielectric line 225 may be traces along a layer (or along a surface of a layer) of the substrate 210, with the at least one dielectric line 225 being disposed between the at least one receiver signal line 215 and the at least one transmitter signal line 220. Crosstalk between the receiver signal line(s) 215 and the transmitter signal line(s) 220 may be reduced (if not prevented) in a similar manner as with the embodiments directed to vias, as described above.

These and other functions of the example 200 of a semiconductor substrate (and its components) are described in greater detail herein with respect to FIGS. 1 and 3-5.

Figure 3A:
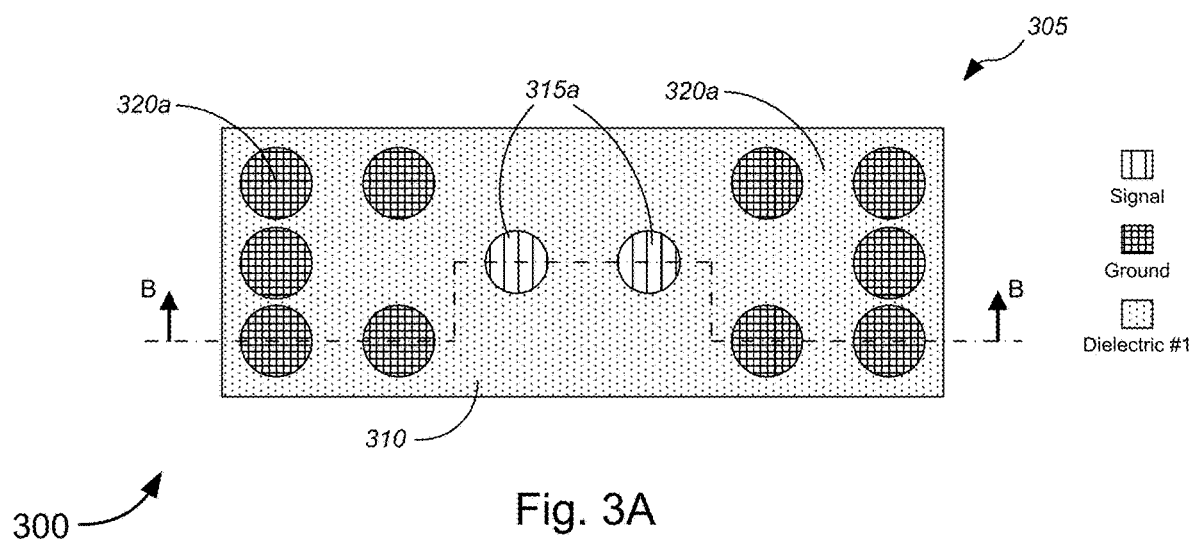
FIGS. 3A-3C are schematic diagrams illustrating various views of a non-limiting example of a configuration of ground shielding for signal lines disposed in a semiconductor substrate, in accordance with various embodiments.
Figure 3B:
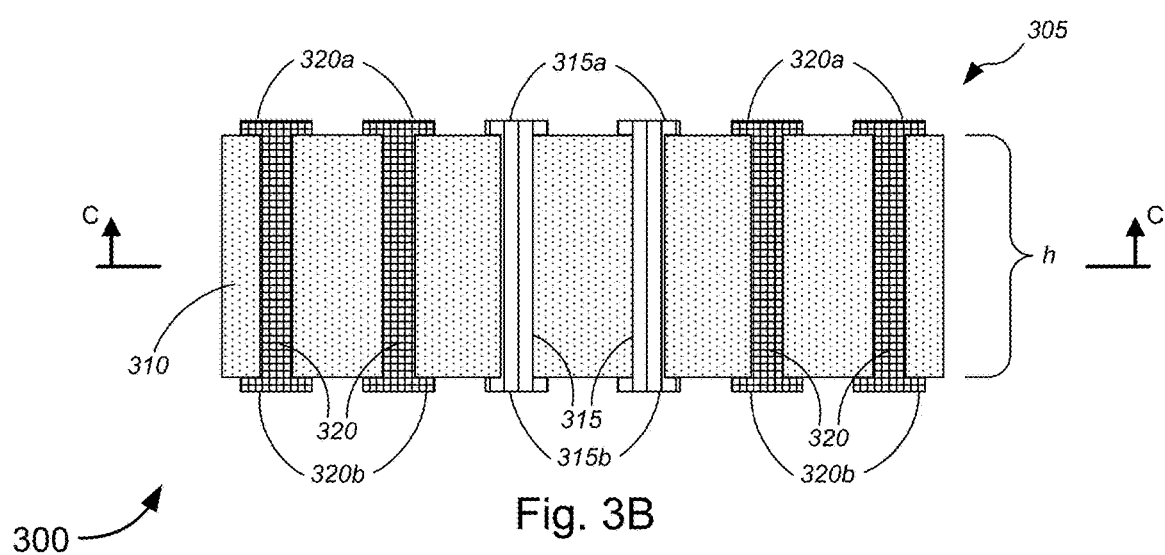
Figure 3C:
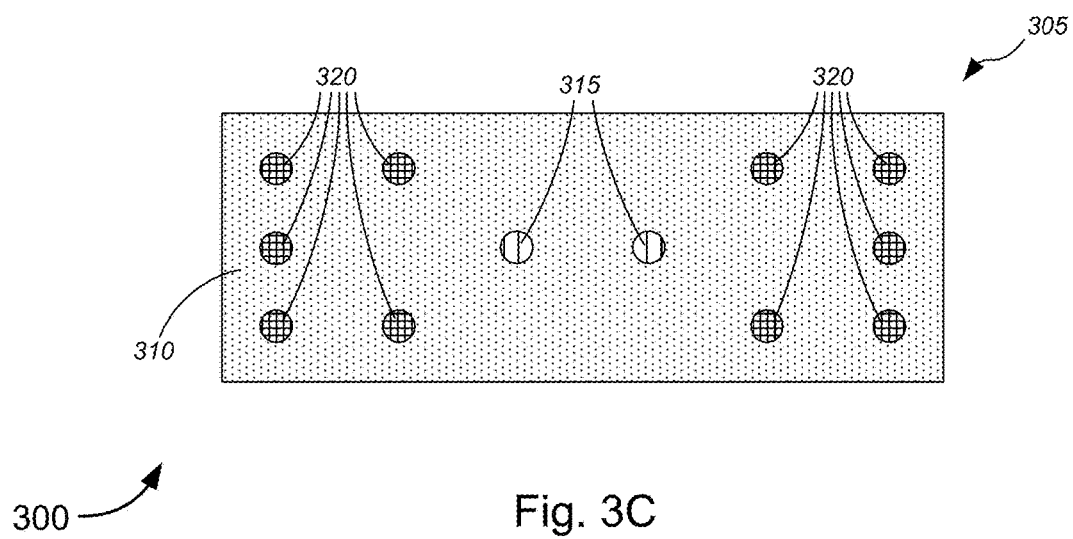

FIGS. 3A-3C (collectively, "FIG. 3") are schematic diagrams illustrating various views of a non-limiting example 300 of a semiconductor substrate having a configuration of ground shielding for signal lines disposed in the semiconductor substrate, in accordance with various embodiments. FIG. 3A shows a top view of a semiconductor device, substrate, and/or package 305, while FIG. 3B shows a cross-sectional side view of the semiconductor device, substrate, and/or package 305 taken along the B-B direction denoted in FIG. 3A by a dot-dash line between the pair of sectional arrows each labelled "B," and FIG. 3C shows a cross-sectional view of the full semiconductor device, substrate, and/or package 305 of FIG. 3A that is taken along the C-C direction denoted in FIG. 3B by the pair of sectional arrows each labelled "C." Regarding FIG. 3C, rather than a true cross-sectional view of FIG. 3B along the C-C direction, which would result in only the top half of FIG. 3C being shown, the full view of the bottom portion of top half of the substrate 310 of the semiconductor device, substrate, and/or package 305 of FIG. 3A is shown (i.e., the semiconductor device, substrate, and/or package 305 of FIG. 3A that is sectioned in half with respect to the height h of the substrate 310 of the semiconductor device, substrate, and/or package 305 of FIG. 3B is shown).

In the non-limiting example 300 of FIG. 3, the semiconductor device, substrate, and/or package 305 comprises a substrate 310, which may include, without limitation, (a) a conventional printed circuit board ("PCB") substrate or (b) a substrate as shown and described above with respect to FIG. 1 (e.g., a substrate having an aerogel core layer sandwiched by buildup layers or sublayers made of polymer resin matrix embedded with one of a plurality of hollow silica spheres 145 or a plurality of aerogel spheres 150, or the like). In some embodiments, semiconductor device, substrate, and/or package 305 and/or substrate 310 includes, without limitation, at least one signal line 315 (in this case, a pair of signal lines, although not limited to two) and at least one ground line 320 (in this case, a five parallel ground lines, although not limited to five) disposed on either side of the at least one signal line 315 (such as shown, e.g., in FIG. 3A-3C). As shown in FIGS. 3A and 3B, each signal line 315 includes a contact pad 315a on a top surface of the substrate 310 and a contact pad 315b on a bottom surface of the substrate 310, while each ground line 320 includes a contact pad 320a on a top surface of the substrate 310 and a contact pad 320b on a bottom surface of the substrate 310. In some cases, the contact pads 320a/320b of adjacent ground lines 320 are separate and resemble the contact pads 315a/315b of the signal line(s) 315 (such as shown in FIGS. 3A and 3B).

The signal line(s) 315 and the ground line(s) 320 are each formed from a conductive material (e.g., a metal, such as but not limited to, copper, or any suitable conductor, or the like), with the signal line(s) 315 being connected to a signal plane or a signal source, while the ground line(s) 320 is connected to a ground plane or a ground terminal. The substrate 310 is formed from a dielectric material (such as conventional dielectric material for PCBs or the layered, gas-filled layers of substrate 110, 110', or 110" of FIG. 1, or the like). The configuration of the ground lines 320 on either side of the signal line(s) 315, both disposed within the dielectric material of substrate 310, provide for signal integrity of signals transmitted through signal line(s) 315.

These and other functions of the example 300 of a semiconductor substrate (and its components) are described in greater detail herein with respect to FIGS. 1, 2, 4, and 5.

Figure 4A:
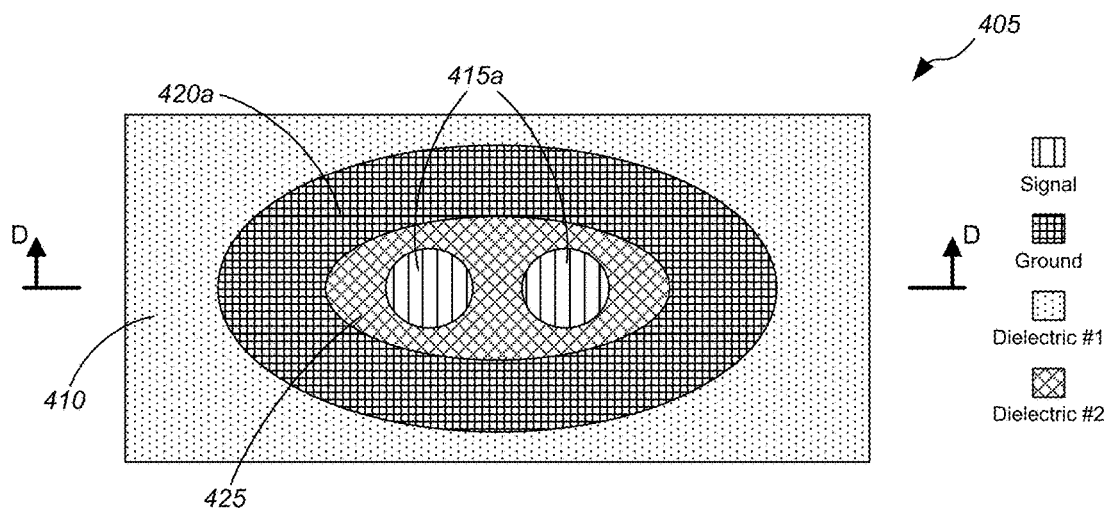
FIGS. 4A-4C are schematic diagrams illustrating various views of a non-limiting example of another configuration of ground shielding for signal lines disposed in a semiconductor substrate, in accordance with various embodiments.
Figure 4B:
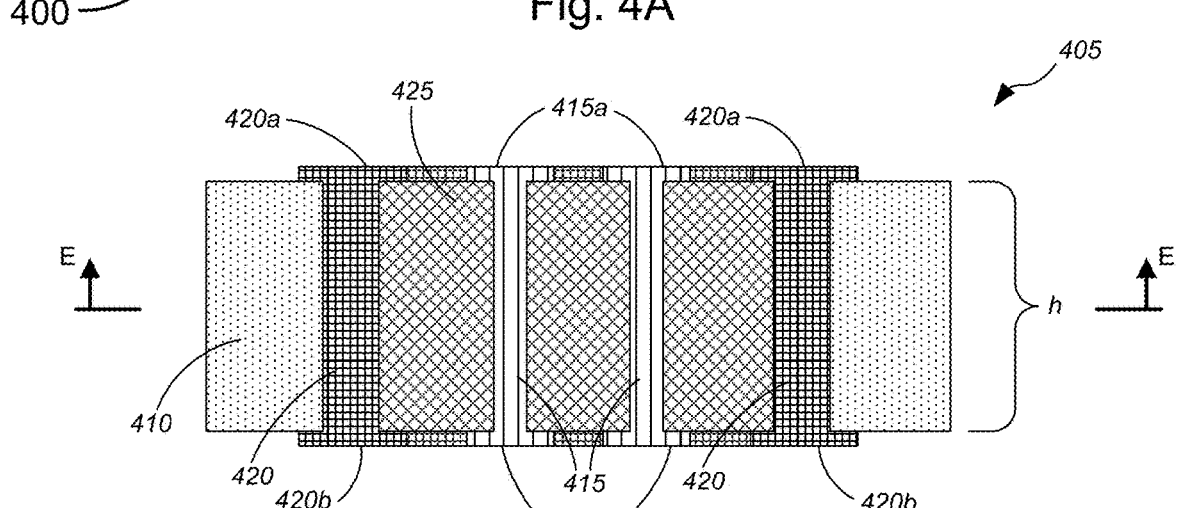
Figure 4C:
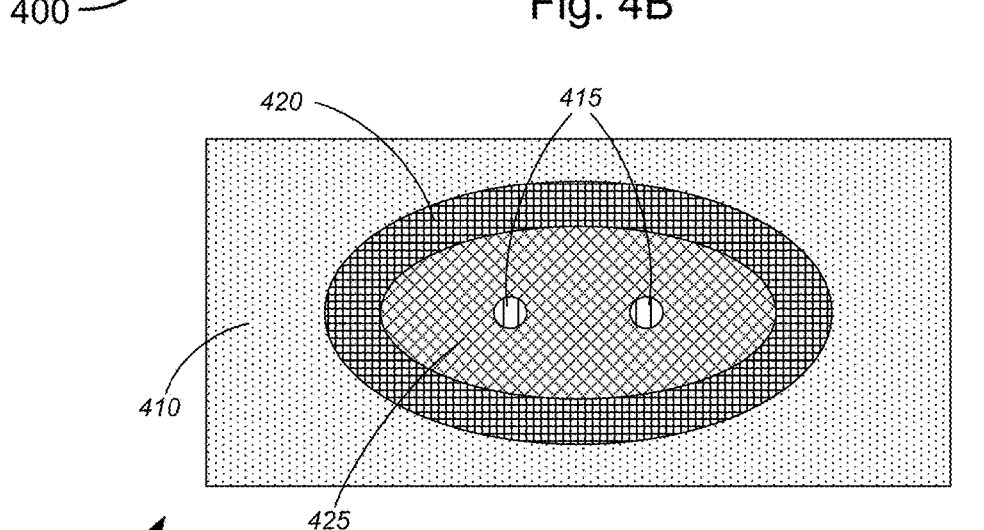

FIGS. 4A-4C (collectively, "FIG. 4") are schematic diagrams illustrating various views of a non-limiting example 400 of a semiconductor substrate having another configuration of ground shielding for signal lines disposed in the semiconductor substrate, in accordance with various embodiments. FIG. 4A shows a top view of a semiconductor device, substrate, and/or package 405, while FIG. 4B shows a cross-sectional side view of the semiconductor device, substrate, and/or package 405 taken along the D-D direction denoted in FIG. 4A by the pair of sectional arrows each labelled "D," and FIG. 4C shows a cross-sectional view of the full semiconductor device, substrate, and/or package 405 of FIG. 4A that is taken along the E-E direction denoted in FIG. 4B by the pair of sectional arrows each labelled "E." Regarding FIG. 4C, rather than a true cross-sectional view of FIG. 4B along the E-E direction, which would result in only the top half of FIG. 4C being shown, the full view of the bottom portion of top half of the substrate 410 of the semiconductor device, substrate, and/or package 405 of FIG. 4A is shown (i.e., the semiconductor device, substrate, and/or package 405 of FIG. 4A that is sectioned in half with respect to the height h of the substrate 410 of the semiconductor device, substrate, and/or package 405 of FIG. 4B is shown). As shown in FIGS. 4A and 4B, each signal line 415 includes a contact pad 415a on a top surface of the substrate 410 and a contact pad 415b on a bottom surface of the substrate 410, while the first region 420 (which, in this case, is in the form of an elliptical annulus, although not limited to such shape) includes a contact pad 420a on a top surface of the substrate 410 and a contact pad 420b on a bottom surface of the substrate 410 (in this case, contact pads 420a and 420b each in the form of an elliptical annulus, although not limited to such shape). Although FIG. 4 depicts the first region 420 as having a thick-walled region with wide annular contact pad 420a or 420b compared with each signal line 415 with relatively smaller annular contact pad 415a or 415b, the various embodiments are not so limited, and the first region 420 can be thinner (e.g., the same diameter or smaller diameter compared with each signal line 415), or the like.

In the non-limiting example 400 of FIG. 4, the semiconductor device, substrate, and/or package 405 comprises a substrate 410, which may include, without limitation, (a) a conventional printed circuit board ("PCB") substrate or (b) a substrate as shown and described above with respect to FIG. 1 (e.g., a substrate having an aerogel core layer sandwiched by buildup layers or sublayers made of polymer resin matrix embedded with one of a plurality of hollow silica spheres 145 or a plurality of aerogel spheres 150, or the like). In some embodiments, semiconductor device, substrate, and/or package 405 and/or substrate 410 includes, without limitation, at least one signal line 415 (in this case, a pair of signal lines, although not limited to two), a first region 420 (similar to the first region described above with respect to FIG. 1, or the like) surrounding the at least one signal line 415 (in some cases, coaxial with the at least one signal line 415, or the like), and a second region 425 (similar to the second region described above with respect to FIG. 1, or the like) disposed between the at least one signal line 415 and the first region 420.

The signal line(s) 415 and the first region 420 are each formed from a conductive material (e.g., a metal, such as but not limited to, copper, or any suitable conductor, or the like), with the signal line(s) 415 being connected to a signal plane or a signal source, while the first region 420 is connected to a ground plane or a ground terminal. The substrate 410 is formed from one or more dielectric materials (such as conventional dielectric material for PCBs or the layered, gas-filled layers of substrate 110, 110', or 110" of FIG. 1, or the like), while the second region 425 is formed from a dielectric material having a dielectric constant that is less than, equal to, or greater than that of the one or more dielectric materials of the substrate 410. The configuration of the grounded first region 420 surrounding the signal line(s) 415, with the second region made of a dielectric material, provide for improved signal integrity of signals transmitted through signal line(s) 415 (even as compared with signal integrity as obtained by the configuration as shown and described above with respect to FIG. 3).

These and other functions of the example 400 of a semiconductor substrate (and its components) are described in greater detail herein with respect to FIGS. 1-3 and 5.

Figure 5A:
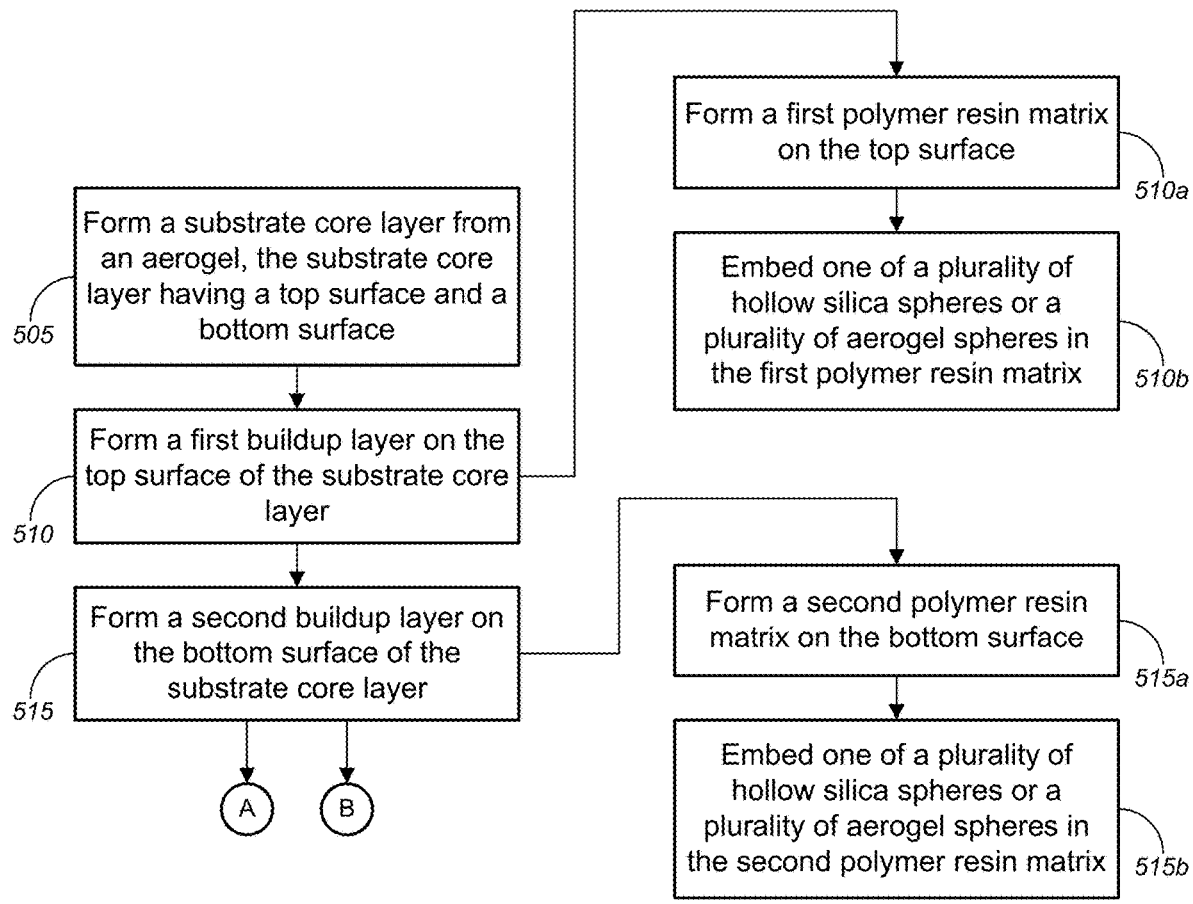
FIGS. 5A-5D are flow diagrams illustrating a method for implementing a process for forming a semiconductor substrate or a semiconductor package for implementing mixed dielectric materials for improving signal integrity of the semiconductor packages, in accordance with various embodiments.
Figure 5B:
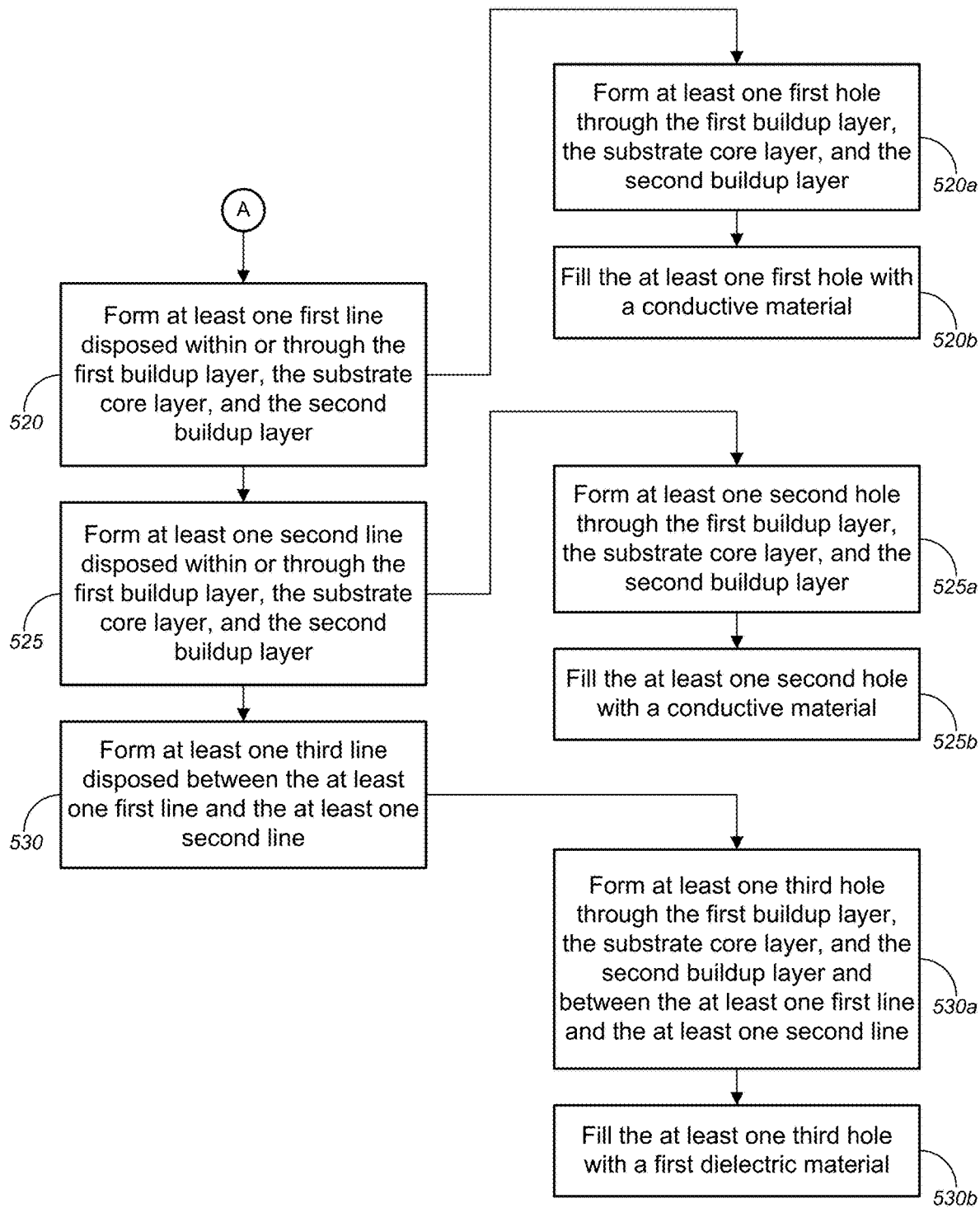
Figure 5C:
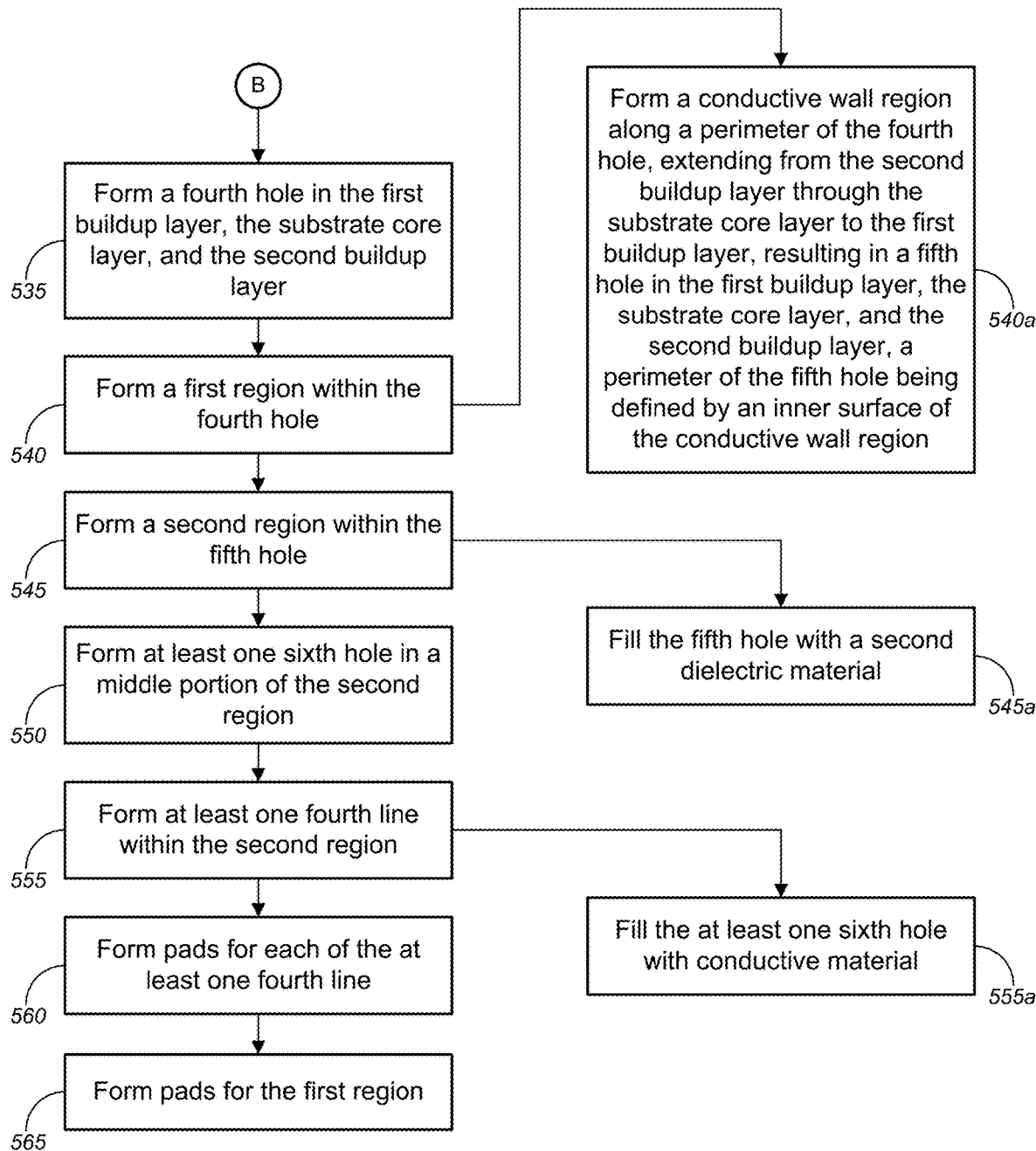
Figure 5D:
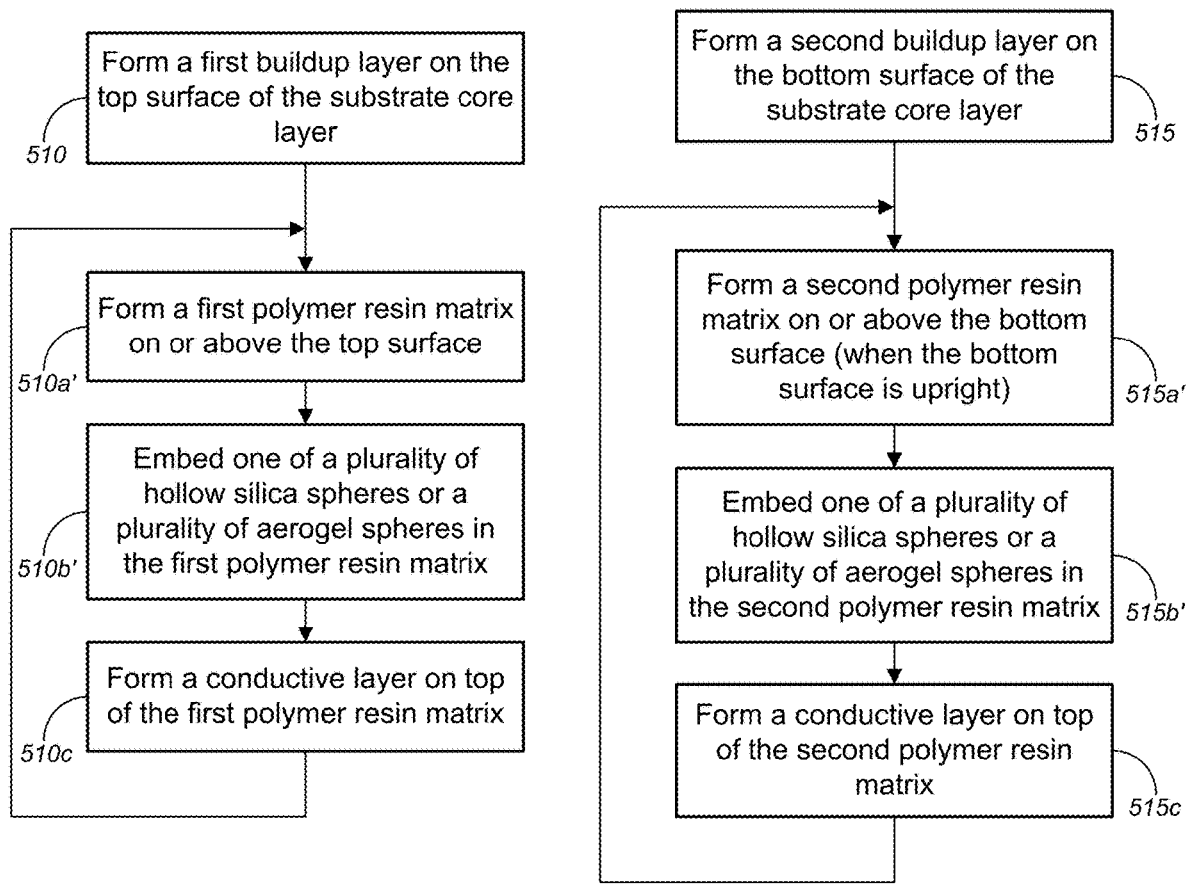

FIGS. 5A-5D (collectively, "FIG. 5") are flow diagrams illustrating a method 500 for implementing a process for forming a semiconductor substrate or a semiconductor package for implementing mixed dielectric materials for improving signal integrity of the semiconductor packages, in accordance with various embodiments. FIG. 5A depicts a non-limiting example of a process for forming a semiconductor substrate (such as, but not limited to, the substrate 110, 110', or 110" of FIG. 1, or the like), while FIG. 5B depicts a non-limiting example of a process for forming a shield between two sets of signal lines (such as, but not limited to, the at least one dielectric line 225 of FIG. 2, or the like), and FIG. 5C depicts a non-limiting example of a process for forming a coaxial ground shield for improved signal integrity (such as, but not limited to, the first region 420 coaxial with, and surrounding, the at least one signal line 415 of FIG. 4, or the like). FIG. 5D depicts non-limiting examples of processes for forming a plurality of sub-layers for buildup layers that have a plurality of sub-layers.

Method 500 of FIG. 5A continues onto one of FIG. 5B following the circular marker denoted, "A," or FIG. 5C following the circular marker denoted, "B."

While the techniques and procedures are depicted and/or described in a certain order for purposes of illustration, it should be appreciated that certain procedures may be reordered and/or omitted within the scope of various embodiments. Moreover, while the method 500 illustrated by FIG. 5 can be implemented by or with (and, in some cases, are described below with respect to) the systems, examples, or embodiments 100, 100', 100", 100'", 100"", 200, 300, and 400 of FIGS. 1A, 1B, 1C, 1D, 1E, 2, 3, and 4, respectively (or components thereof), such methods may also be implemented using any suitable hardware (or software) implementation. Similarly, while each of the systems, examples, or embodiments 100, 100', 100", 100'", 100"", 200, 300, and 400 of FIGS. 1A, 1B, 1C, 1D, 1E, 2, 3, and 4, respectively (or components thereof), can operate according to the method 500 illustrated by FIG. 5 (e.g., by executing instructions embodied on a computer readable medium), the systems, examples, or embodiments 100, 100', 100", 100'", 100"", 200, 300, and 400 of FIGS. 1A, 1B, 1C, 1D, 1E, 2, 3, and 4 can each also operate according to other modes of operation and/or perform other suitable procedures.

In the non-limiting embodiment of FIG. 5A, method 500, at block 505, comprises forming a substrate core layer from an aerogel, the substrate core layer having a top surface and a bottom surface. In some embodiments, the aerogel includes, without limitation, one of a silica aerogel, an alumina aerogel, a titania aerogel, a zirconia aerogel, a carbon aerogel, or a metal oxide aerogel, and/or the like. In some cases, the aerogel has a dielectric constant of 3.0 or less. In some instances, the aerogel has at least one of a low electric loss tangent material or a low magnetic loss tangent material.

Method 500 further comprises, at block 510, forming a first buildup layer on the top surface of the substrate core layer, for example, by forming a first polymer resin matrix on the top surface (block 510*a*) and by embedding one of a plurality of hollow silica spheres or a plurality of aerogel spheres in the first polymer resin matrix (block 510*b*). At block 515, method 500 further comprises forming a second buildup layer on the bottom surface of the substrate core layer, for example, by forming a second polymer resin matrix on the bottom surface (block 515*a*) and by embedding one of a plurality of hollow silica spheres or a plurality of aerogel spheres in the second polymer resin matrix (block 515*b*). According to some embodiments, the plurality of aerogel spheres include, but is not limited to, one of a plurality of silica aerogel spheres, a plurality of alumina aerogel spheres, a plurality of titania aerogel spheres, a plurality of zirconia aerogel spheres, a plurality of carbon aerogel spheres, or a plurality of metal oxide aerogel spheres, and/or the like. In some cases, the second buildup layer is the same as the first buildup layer. In some instances, the plurality of hollow silica spheres or the plurality of aerogel spheres comprises spheres of differing sizes.

Method 500 continues onto one of the process at block 520 in FIG. 5B following the circular marker denoted, "A," or the process at block 535 in FIG. 5C following the circular marker denoted, "B."

At block 520 in FIG. 5B (following the circular marker denoted, "A," from FIG. A), method 500 comprises forming at least one first line disposed within or through the first buildup layer, the substrate core layer, and the second buildup layer, for example, by forming at least one first hole through the first buildup layer, the substrate core layer, and the second buildup layer (block 520*a*), and by filling the at least one first hole with a conductive material (block 520*b*). The at least one first line is configured as a conductive signal path or as a conductive via for at least one first signal.

Method 500 further comprises, at block 525, forming at least one second line disposed within or through the first buildup layer, the substrate core layer, and the second buildup layer, for example, by forming at least one second hole through the first buildup layer, the substrate core layer, and the second buildup layer (block 525*a*), and by filling the at least one second hole with a conductive material (block 525*b*). The at least one second line is configured as a conductive signal path or as a conductive via for at least one second signal that is different from the at least one first signal.

Method 500, at block 530, comprises forming at least one third line disposed between the at least one first line and the at least one second line, for example, by forming at least one third hole through the first buildup layer, the substrate core layer, and the second buildup layer and between the at least one first line and the at least one second line (block 530*a*), and by filling the at least one third hole with a first dielectric material (block 530*b*). The at least one third line is configured as a shield between the at least one first line and the at least one second line. The first dielectric material has a dielectric constant that is higher than a dielectric constant of each of the first buildup layer, the substrate core layer, and the second buildup layer.

At block 535 in FIG. 5C (following the circular marker denoted, "B," from FIG. 5A), method 500 comprises forming a fourth hole in the first buildup layer, the substrate core layer, and the second buildup layer.

Method 500, at block 540, comprises forming a first region within the fourth hole, for example, by forming a conductive wall region along a perimeter of the fourth hole, extending from the second buildup layer through the substrate core layer to the first buildup layer, resulting in a fifth hole in the first buildup layer, the substrate core layer, and the second buildup layer, a perimeter of the fifth hole being defined by an inner surface of the conductive wall region (block 540*a*).

Method 500 further comprises, at block 545, forming a second region within the fifth hole, for example, by filling the fifth hole with a second dielectric material (block 545*a*). Method 500 further comprises forming at least one sixth hole in a middle portion of the second region (block 550).

Method 500 further comprises, at block 555, forming at least one fourth line within the second region, for example, by filling the at least one sixth hole with conductive material (block 555*a*).

Method 500 further comprises forming pads for each of the at least one fourth line (on either side of the substrate; such as shown, e.g., in FIG. 4) (block 560); and forming pads for the first region (also on either side of the substrate; such as shown, e.g., in FIG. 4) (block 565).

According to some embodiments, at least one of the first buildup layer or the second buildup layer comprises a plurality of sub-layers. Referring to the non-limiting example of FIG. 5D, for the first buildup layer that has a plurality of sub-layers, forming the first buildup layer (at block 510) comprises forming a plurality of first sub-layers with intervening conductive layers between first sub-layers, by forming a first polymer resin matrix on or above the top surface (block 510a'; similar to block 510a); embedding one of a plurality of hollow silica spheres or a plurality of aerogel spheres in the first polymer resin matrix (block 510b'; similar to block 510b); forming a conductive layer on top of the first polymer resin matrix (block 510c); and repeating the processes at blocks 510a', 510b', and 510c until the desired number of dielectric layers (similar to dielectric layers 165 of FIG. 1E, or the like) and the desired number of conductive layers (similar to conductive layers 170 of FIG. 1E, or the like) have been formed. In some instances, the plurality of first sub-layers is made of a corresponding plurality of first sub-materials, as described in detail above with respect to FIG. 1E, or the like.

Similarly, for the second buildup layer that has a plurality of sub-layers, forming the second buildup layer (at block 515) comprises forming a plurality of second sub-layers with intervening conductive layers between second sub-layers, by forming a second polymer resin matrix on or above the bottom surface (when the bottom surface is upright or oriented to face upward) (block 515a'; similar to block 515a); embedding one of a plurality of hollow silica spheres or a plurality of aerogel spheres in the second polymer resin matrix (block 515b'; similar to block 515b); forming a conductive layer on top of the second polymer resin matrix (block 515c); and repeating the processes at blocks 515a', 515b', and 515c until the desired number of dielectric layers (similar to dielectric layers 165 of FIG. 1E, or the like) and the desired number of conductive layers (similar to conductive layers 170 of FIG. 1E, or the like) have been formed. In some instances, the plurality of second sub-layers is made of a corresponding plurality of second sub-materials, as described in detail above with respect to FIG. 1E, or the like.

While particular features and aspects have been described with respect to some embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture but instead can be implemented on any suitable hardware, firmware and/or software configuration. Similarly, while particular functionality is ascribed to particular system components, unless the context dictates otherwise, this functionality need not be limited to such and can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—particular features for ease of description and to illustrate some aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A substrate for a semiconductor device, comprising:
a first layer, the first layer comprising a first material;
a second layer, the second layer comprising a second material;
a third layer disposed between the first and second layers, the third layer comprising a third material that is different from the first and second materials, the first, second, and third layers each containing a plurality of gas-filled regions;
at least one first line disposed within or through the first, second, and third layers, the at least one first line being configured as a conductive signal path or as a conductive via for at least one first signal;
at least one second line disposed within or through the first, second, and third layers, the at least one second line being configured as a conductive signal path or as a conductive via for at least one second signal that is different from the at least one first signal; and
at least one third line disposed between the at least one first line and the at least one second line, the at least one third line comprising a fourth material that is configured as a shield between the at least one first line and the at least one second line, the fourth material having a dielectric constant that is higher than a dielectric constant of each of the first, second, and third materials.

2. The substrate for a semiconductor device of claim 1, wherein the third material comprises an aerogel, the aerogel comprising one of a silica aerogel, an alumina aerogel, a titania aerogel, a zirconia aerogel, a carbon aerogel, or a metal oxide aerogel, wherein the third material has a dielectric constant of 3.0 or less.

3. The substrate for a semiconductor device of claim 1, wherein the first layer and the second layer are buildup layers or sublayers of the substrate, wherein the first material and the second material each comprises a polymer resin matrix embedded with one of a plurality of hollow silica spheres or a plurality of aerogel spheres.

4. The substrate for a semiconductor device of claim 3, wherein the plurality of aerogel spheres comprises one of a plurality of silica aerogel spheres, a plurality of alumina aerogel spheres, a plurality of titania aerogel spheres, a plurality of zirconia aerogel spheres, a plurality of carbon aerogel spheres, or a plurality of metal oxide aerogel spheres.

5. The substrate for a semiconductor device of claim 3, wherein the second material is the same as the first material, wherein the plurality of hollow silica spheres or the plurality of aerogel spheres comprises spheres of differing sizes.

6. The substrate for a semiconductor device of claim 1, wherein at least one of the first layer or the second layer comprises a plurality of sub-layers, wherein the corresponding at least one of the first material and the second material each comprises a plurality of sub-materials, each sub-material and an adjacent sub-material are one of the same sub-material or a different sub-material.

7. The substrate for a semiconductor device of claim 1, further comprising:
  at least one fourth line disposed within or through the first, second, and third layers, the at least one fourth line being configured as a conductive signal path or as a conductive via for at least one third signal;
  a first region disposed within or through the first, second, and third layers and surrounding the at least one fourth line, the first region comprising a conductive material and being configured to serve as a grounding shield, the first region having a cross-sectional shape comprising one of an annulus, an elliptical annulus, a square annulus, a rectangular annulus, or other polygonal annulus; and
  a second region disposed within or through the first, second, and third layers and disposed between the at least one fourth line and the first region, the second region comprising a fifth material having one of a dielectric constant that is the same as a dielectric constant of the third material, a dielectric constant that is less than the dielectric constant of the third material, or a dielectric constant that is greater than the dielectric constant of the third material.

8. The substrate for a semiconductor device of claim 1, further comprising:
  at least one fifth line disposed on one of the first or second layers, the at least one fifth line being configured as a conductive signal path for at least one fourth signal;
  at least one sixth line disposed on the one of the first or second layers, the at least one sixth line being configured as a conductive signal path for at least one fifth signal that is different from the at least one fourth signal; and
  at least one seventh line disposed between the at least one fifth line and the at least one sixth line on the one of the first or second layers, the at least one seventh line comprising a sixth material that is configured as a shield between the at least one fifth line and the at least one sixth line, the sixth material having a dielectric constant that is higher than a dielectric constant of the first material and the second material.

9. A semiconductor package, comprising:
  a substrate comprising one or more layers each containing a plurality of gas-filled regions;
  at least one first line disposed on a surface of, within, or through the substrate, the at least one first line being configured as a conductive signal path for at least one first signal;
  at least one second line disposed on a surface of, within, or through the substrate, the at least one second line being configured as a conductive signal path for at least one second signal;
  at least one third line disposed between the at least one first line and the at least one second line, the at least one third line comprising a first dielectric material that is configured as a shield between the at least one first line and the at least one second line, the first dielectric material having a dielectric constant that is higher than a dielectric constant of the one or more materials of the substrate;
  at least one fourth line disposed within or through the substrate, the at least one fourth line being configured as a conductive signal path or as a conductive via for at least one third signal;
  a first region disposed within or through the substrate and surrounding the at least one fourth line, the first region comprising a conductive material and being configured to serve as a grounding shield, the first region having a cross-sectional shape comprising one of an annulus, an elliptical annulus, a square annulus, a rectangular annulus, or other polygonal annulus; and
  a second region disposed within or through the substrate and disposed between the at least one fourth line and the first region, the second region comprising a second dielectric material having one of a dielectric constant that is the same as a dielectric constant of the one or more materials of the substrate, a dielectric constant that is less than the dielectric constant of the one or more materials of the substrate, or a dielectric constant that is greater than the dielectric constant of the one or more materials of the substrate.

10. The semiconductor package of claim 9, wherein the substrate further comprises:
  at least one first layer, the at least one first layer comprising at least one first material among the one or more materials;
  at least one second layer, the at least one second layer comprising at least one second material among the one or more materials; and
  a third layer disposed between the at least one first layer and the at least one second layer, the third layer comprising a third material among the one or more materials, the third material being different from each of the at least one first material and the at least one second material;
  wherein the at least one first layer and the at least one second layer are the buildup layers or sublayers of the substrate, wherein the at least one first material and the at least one second material each comprises a polymer resin matrix embedded with one of a plurality of hollow silica spheres or a plurality of aerogel spheres, wherein the plurality of aerogel spheres comprises one of a plurality of silica aerogel spheres, a plurality of alumina aerogel spheres, a plurality of titania aerogel spheres, a plurality of zirconia aerogel spheres, a plurality of carbon aerogel spheres, or a plurality of metal oxide aerogel spheres;
  wherein the third layer is a core layer of the substrate, wherein the third material of the substrate comprises an aerogel, the aerogel comprising one of a silica aerogel, an alumina aerogel, a titania aerogel, a zirconia aerogel, a carbon aerogel, or a metal oxide aerogel, wherein the third material of the substrate has a dielectric constant of 3.0 or less.

11. The semiconductor package of claim 10, wherein the at least one first line and the at least one second line are each configured as a conductive via through the at least one first layer, the at least one second layer, and the third layer of the substrate, wherein the at least one third line is configured as a dielectric via through the at least one first layer, the at least one second layer, and the third layer of the substrate and between the conductive vias of the at least one first line and the at least one second line, wherein the dielectric via is further configured as a lossy and absorptive shield that reduces crosstalk between the at least one first line and the at least one second line.

12. The semiconductor package of claim 9, wherein the at least one first line comprises a pair of receiver signal lines, wherein the at least one second line comprises a pair of transmission signal lines.

13. The semiconductor package of claim 9, further comprising:
- at least one fourth line disposed within or through the substrate, the at least one fourth line being configured as a conductive signal path or as a conductive via for at least one third signal;
- a first region disposed within or through the substrate and surrounding the at least one fourth line, the first region comprising a conductive material and being configured to serve as a grounding shield, the first region having a cross-sectional shape comprising one of an annulus, an elliptical annulus, a square annulus, a rectangular annulus, or other polygonal annulus; and
- a second region disposed within or through the substrate and disposed between the at least one fourth line and the first region, the second region comprising a second dielectric material having one of a dielectric constant that is the same as a dielectric constant of the one or more materials of the substrate, a dielectric constant that is less than the dielectric constant of the one or more materials of the substrate, or a dielectric constant that is greater than the dielectric constant of the one or more materials of the substrate.

14. A substrate for a semiconductor device, comprising:
a first layer, the first layer comprising a first material;
a second layer, the second layer comprising a second material;
a third layer disposed between the first and second layers, the third layer comprising a third material that is different from the first and second materials, the first, second, and third layers each containing a plurality of gas-filled regions;
at least one fifth line disposed on one of the first or second layers, the at least one fifth line being configured as a conductive signal path for at least one fourth signal;
at least one sixth line disposed on the one of the first or second layers, the at least one sixth line being configured as a conductive signal path for at least one fifth signal that is different from the at least one fourth signal; and
at least one seventh line disposed between the at least one fifth line and the at least one sixth line on the one of the first or second layers, the at least one seventh line comprising a sixth material that is configured as a shield between the at least one fifth line and the at least one sixth line, the sixth material having a dielectric constant that is higher than a dielectric constant of the first material and the second material.

\* \* \* \* \*